(12) United States Patent
Rhodes et al.

(10) Patent No.: US 8,329,838 B2
(45) Date of Patent: Dec. 11, 2012

(54) NORBORNENE-TYPE POLYMERS, COMPOSITIONS THEREOF AND LITHOGRAPHIC PROCESSES USING SUCH COMPOSITIONS

(75) Inventors: Larry F. Rhodes, Silver Lake, OH (US); Chun Chang, Stow, OH (US); Pramod Kandanarachchi, Brecksville, OH (US); Lawrence D. Seger, Gates Mills, OH (US); Keita Ishiduka, Kawasaki (JP); Kotaro Endo, Kawasaki (JP); Tomoyuki Ando, Kawasaki (JP)

(73) Assignee: Promerus LLC, Brecksville, OH (US)

( * ) Notice: Subject to any disclaimer, the term of this patent is extended or adjusted under 35 U.S.C. 154(b) by 0 days.

(21) Appl. No.: 12/884,786

(22) Filed: Sep. 17, 2010

(65) Prior Publication Data

US 2011/0065878 A1   Mar. 17, 2011

Related U.S. Application Data

(60) Division of application No. 11/359,880, filed on Feb. 22, 2006, now Pat. No. 7,799,883, which is a continuation-in-part of application No. 11/358,903, filed on Feb. 21, 2006, now abandoned.

(60) Provisional application No. 60/655,176, filed on Feb. 22, 2005, provisional application No. 60/655,351, filed on Feb. 23, 2005, provisional application No. 60/729,091, filed on Oct. 21, 2005, provisional application No. 60/655,901, filed on Feb. 25, 2005, provisional application No. 60/687,871, filed on Jun. 7, 2005, provisional application No. 60/728,756, filed on Oct. 21, 2005.

(51) Int. Cl.
*G03F 7/039* (2006.01)
*G03F 7/038* (2006.01)
*C08F 32/04* (2006.01)

(52) U.S. Cl. ..................... 526/243; 430/270.1

(58) Field of Classification Search ........................ None
See application file for complete search history.

(56) References Cited

U.S. PATENT DOCUMENTS

| | | | |
|---|---|---|---|
| 5,700,620 A | 12/1997 | Sakaguchi et al. | |
| 6,136,499 A * | 10/2000 | Goodall et al. | 430/270.1 |
| 6,235,849 B1 | 5/2001 | Jayaraman et al. | |
| 6,350,832 B1 | 2/2002 | Bell et al. | |
| 6,420,503 B1 | 7/2002 | Jayaraman et al. | |
| 6,455,650 B1 | 9/2002 | Lipian et al. | |
| 6,878,501 B2 | 4/2005 | Hatakeyama et al. | |
| 7,335,456 B2 | 2/2008 | Li et al. | |
| 7,358,029 B2 * | 4/2008 | Allen et al. | 430/270.1 |
| 7,473,749 B2 | 1/2009 | Ito et al. | |
| 2001/0053498 A1 | 12/2001 | Fujimoto et al. | |
| 2002/0081533 A1 | 6/2002 | Simons et al. | |
| 2004/0038147 A1 | 2/2004 | Ray et al. | |
| 2004/0161698 A1 | 8/2004 | Kanagasabapathy et al. | |
| 2004/0166436 A1 | 8/2004 | Rhodes et al. | |
| 2004/0219452 A1 | 11/2004 | Rhodes et al. | |
| 2005/0153232 A1 * | 7/2005 | Li et al. | 430/270.1 |
| 2005/0153240 A1 | 7/2005 | Wu et al. | |
| 2005/0202351 A1 | 9/2005 | Houlihan et al. | |
| 2005/0250898 A1 | 11/2005 | Maeda et al. | |
| 2005/0266354 A1 | 12/2005 | Li et al. | |
| 2005/0277059 A1 | 12/2005 | Kanda | |
| 2006/0008734 A1 | 1/2006 | Amoroso et al. | |
| 2006/0041093 A1 * | 2/2006 | Ravikiran et al. | 526/282 |
| 2006/0105269 A1 * | 5/2006 | Khojasteh et al. | 430/270.1 |

FOREIGN PATENT DOCUMENTS

| | | |
|---|---|---|
| EP | 079458 A2 | 9/1997 |
| EP | 0931816 A1 | 7/1999 |
| EP | 1376232 A1 | 1/2004 |
| EP | 1415974 A1 | 5/2004 |
| EP | 1505439 A2 | 2/2005 |
| WO | 0001747 | 1/2000 |
| WO | 0020472 | 4/2000 |
| WO | 2004076495 A2 | 9/2004 |
| WO | WO-2006/050609 A1 * | 5/2006 |

* cited by examiner

*Primary Examiner* — Cynthia Hamilton
(74) *Attorney, Agent, or Firm* — The Webb Law Firm

(57) ABSTRACT

Embodiments of the present invention relate generally to non-self imagable and imagable norbornene-type polymers useful for immersion lithographic processes, methods of making such polymers, compositions employing such polymers and the immersion lithographic processes that make use of such compositions. More specifically the embodiments of the present invention are related to norbornene-type polymers useful for forming imaging layer and top-coat layers for overlying such imaging layers in immersion lithographic process and the process thereof.

18 Claims, 1 Drawing Sheet

Non-retained Immersion Fluid

NORBORNENE-TYPE POLYMERS, COMPOSITIONS THEREOF AND LITHOGRAPHIC PROCESSES USING SUCH COMPOSITIONS

PRIORITY

This application is a divisional of and claims priority of U.S. patent application Ser. No. 11/359,880, entitled "Norbornene-type Polymers, Compositions Thereof and Lithographic Process Using Such Compositions", filed Feb. 22, 2006, which is a continuation-in-part of U.S. patent application Ser. No. 11/358,903, entitled "Norbornene-type Polymers, Compositions Thereof and Lithographic Process Using Such Compositions", filed Feb. 21, 2006, which claims priority to U.S. Provisional Application Serial Nos. 60/655,176, 60/655,351 and 60/729,091, each entitled "Norbornene-Type Polymers and Lithographic Process Using Norbornene Type Polymers," filed Feb. 22, 2005, Feb. 23, 2005 and Oct. 21, 2005, respectively, as well as U.S. Provisional Application Serial Nos. 60/655,901, 60/687,871 and 60/728,756 each entitled "Protective film forming material, and method for forming photoresist pattern using the same," filed Feb. 25, 2005, Jun. 7, 2005 and Oct. 21, 2005, respectively, all of the above-identified nonprovisional and provisional patent applications are hereby incorporated by reference in their entirety.

TECHNICAL FIELD

Embodiments in accordance with the present invention relate generally to norbornene-type polymers, methods of making such polymers, compositions employing such polymers and lithographic processes that make use of such compositions; more specifically such embodiments relate to norbornene-type polymers useful for forming compositions that encompass such polymers and the compositions so formed, where such compositions are for forming layers useful in immersion lithographic processes as non-imagable protective layers, imagable layers and combinations thereof as well as immersion lithographic processes that employ such compositions.

BACKGROUND

In the past, methods for achieving smaller feature sizes have been to select a lithographic radiation source having a shorter wavelength, increase the numerical aperture (NA) of the lithographic system's lens or a combination thereof. While these methods have met with success, for each reduction in wavelength and/or increase in NA, the problems associated with taking advantage of such changes have been increasingly difficult to overcome.

Recently it has been suggested that rather than selecting a new lithographic radiation source with a shorter wavelength, e.g. 157 nm, the resolution of the current 193 nm standard source could be extended by the use of an immersion lithographic process. Such immersion lithographic processes replace the usual "air gap" between a lithographic tool's final lens and the substrate being exposed with a fluid such as, for example, water. The water, having a refractive index that is much greater than that of air, allows for the use of a lens having a NA higher than 1 without the reduction in depth of focus (DOF) that would otherwise result. Thus, it is believed that minimum feature sizes of 45 nm or less can be achieved with such an approach.

However, the successful implementation of immersion lithography for microelectronic device fabrication presents new problems that need to be resolved. For example, typically the substrate being exposed during a microlithographic process is repeatedly repositioned with respect to the lithographic tools lens to achieve complete exposure of all portions of the substrate. The presence of an immersion fluid (also referred to herein as an "immersion medium" or "IM") raises the concern that fluid residues will result from this movement and that such residues will result in an increase in defectivity that would make such a process unacceptable. Also with regard to fluid residue, or residuals, it must be considered that any proposed solution to this problem should not result in a significant decrease in the speed with which such movement is currently accomplished, as such a decrease in movement speed (scanability) could result in an unacceptable decrease in the number of substrates per hour that a lithographic tool can fully expose.

In addition to problems relating to IM residuals and scanability, the use of an IM also raises concerns with regard to problems that can result from such a fluid being in direct contact with the photoresist layer that can lead to a reduction in that layers resolution ability. For example, such problems can include, among others: 1) leaching of small molecules such as photoacid generators (PAGs) and PAG photoproducts from the photoresist film into the IM and 2) absorption of the immersion medium, or components thereof, into the photoresist film.

One method that has been investigated for the elimination or reduction of these and other problems associated with immersion lithography is the use of an intervening layer disposed overlying the photoresist film. Such an intervening layer, also referred to as a "top-coat" or "protecting layer," is thus positioned to receive the immersion material and thus prevent or greatly reduce any effects related to previously mentioned technical problems 1 and 2. With regard to scanability, the use of a top-coat allows for the design of a material having specific properties that will eliminate or greatly reduce the possibility of 1M residuals with little or no reduction in the speed of a tool's speed of movement.

Recently, some materials encompassing fluorine-containing polymer(s) have been proposed for use as a top-coat layer. While such materials have been shown to have a positive effect with regards to the problems discussed above, they require the use of a solvent for their removal. As any top-coat layer must be removed to allow for the development of an image in the underlying photoresist layer, a material that requires that a special solvent be used for its removal is problematic in that such removal is an extra step that adds undesirable equipment and material costs as well as costs associated with the reduced productivity such an extra step will necessarily cause.

Therefore, it would be desirable to provide solutions that can be readily implemented, such solutions directed to the above-related technical problems that may occur with immersion lithography. Such solutions should provide for the reduction or prevention of the leaching of small molecules from a photoresist layer into an immersion medium as well as reduce or prevent the absorption of such immersion medium into such a layer. Such solutions should also serve to reduce defectivity from a level observed when immersion lithography is preformed without such solutions being employed. Further, it would be desirable for such solutions to be cost effective and not require significant alternative process such as observed with the aforementioned solvent removable top-coat material or any significant reduction in scanability when employed.

DETAILED DESCRIPTION

Figure 2:
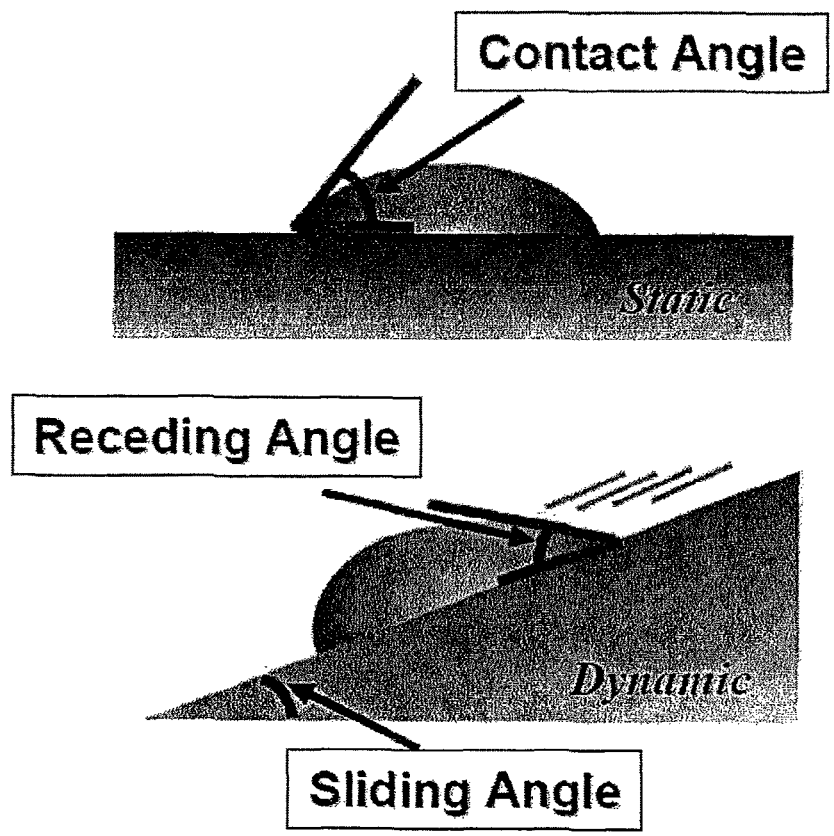
FIG. 2 identifies the contact angle, sliding angle and receding angle with respect to a droplet overlying a surface.

Embodiments in accordance with the present invention are directed to solving the aforementioned technical problems of immersion lithography. Such embodiments encompass polymeric materials, the methods of making such materials, compositions of such materials that are useful for forming both imagable and non-imagable films thereof and immersion lithographic processes that employ such films. Such embodiments provide for the reduction or elimination of the leaching of small molecules from an imaging layer or film into an immersion medium, the absorption of such medium, or components of such medium into the imaging layer, the reduction or elimination of defectivity resulting from any non-retained immersion fluid being formed during the exposure of such imaging layer over the entirety of a substrate without significantly affecting scanability. Where such embodiments encompass a top-coat or non-imagable layer, providing such a layer that is soluble in aqueous base solutions, thus eliminating the need for a distinct top-coat removal step that employs a solvent.

The polymeric materials of the embodiments of the present invention encompass polycyclic repeating units. Such polycyclic repeating units, when referred to as "norbornene-type," are units that are derived from a substituted or unsubstituted norbornene-type monomer, as shown below, where X is —$CH_2$—, —$CH_2CH_2$—, O or S and n is an integer from 0 to 5 inclusive:

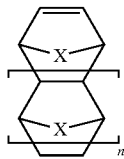

The term "non-self imagable polymer" refers to a polymer (also referred to as a resin) that, when formed into a film or layer having an essentially uniform thickness over a substrate, is not imagable by direct irradiation, for example irradiation by a 193 nanometer (nm) or 157 nm radiation source.

The terms "top-coat material" or 'top-coat composition" are used interchangeably herein and refer to a material or composition that encompasses a non-self imagable polymer. Such composition being useful for forming a protective film over a photoresist layer to protect such photoresist layer during an immersion lithographic process. The protective film (or top-coat layer) is a non-self imagable film.

The term "imagable polymer" refers to a polymer that, when formed into a film or layer having an essentially uniform thickness over a substrate, is imagable by and through direct irradiation, for example irradiation by a 193 nm or 157 nm radiation source.

The terms "imagable material," "imagable composition" or "photoresist material" are used interchangeably herein and refer to a material or composition that encompasses an imagable polymer. Such compositions being useful in the forming of an imaging layer (or photoresist layer) that can be patterned. Photoresist materials of the present invention are useful for immersion and non-immersion lithographic processes.

The terms "immersion material," "immersion medium," and "immersion fluid" are used interchangeably herein and refer to a fluid used to replace air in the exposure radiation pathway between a lens, used for focusing and directing the radiation, and a substrate. The fluid having a refractive index greater than air and less than any layer disposed between a lithographic tool's lens and the upper surface of a substrate, as depicted in FIG. 1.

Figure 1:
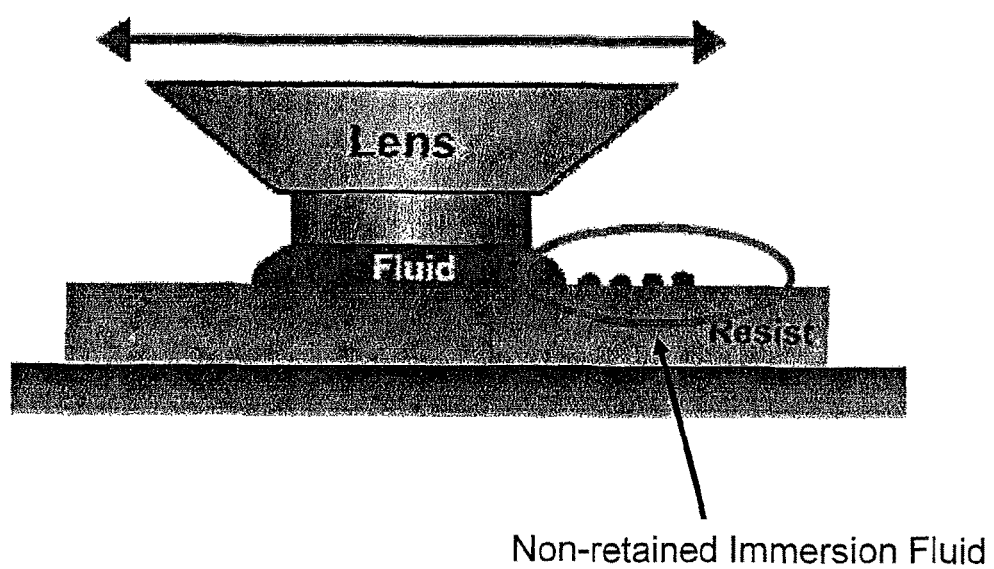
FIG. 1 is a representation of an immersion lithographic system depicting a lens element, having movement in the direction of the arrow, a resist layer and both a fluid (immersion medium) between the resist layer and the lens element as well as non-retained immersion fluid overlying portions of the resist layer.

The terms "non-retained immersion material," "non-retained immersion medium," and "non-retained immersion fluid" are used interchangeably herein and refer to portions of immersion material that is separated from the immersion medium disposed between a lithographic tool's lens and the upper surface of a substrate, as depicted in FIG. 1. Further to this definition, the terms "Scanability" and "Scan Speed Durability" are also used interchangeably herein and refer to the relative speed at which movement of the substrate with respect to the lens. Where an immersion medium is present, a measure of scanability includes whether or not any non-retained immersion material is formed. By way of example, for an immersion lithographic process, the designation of high scanability means that little or no non-retained immersion material is observed at an acceptable rate of lithographic tool motion.

The terms "Contact Angle," "Sliding Angle" and "Receding Angle" refer to the angles identified as such in FIG. 2. Further, the term "Rolling-down Angle" is used interchangeably herein with the term "Sliding Angle."

Polymers

Some embodiments in accordance with the present invention, encompass a non-self imagable norbornene-type polymer, having repeating units represented by some or all of Formulae I, II, III and IV, shown below. Such embodiments encompass a composition that employs such a polymer for forming a top-coat or protective layer over a previously formed photoresist layer. The polymer being non-imagable, such a top-coat layer formed therefrom is also non-self imagable.

The top-coat layer is for receiving an immersion fluid (or medium) to enable an immersion photolithography process by serving to protect or isolate the photoresist or imaging layer from the immersion fluid. That is to say that the photoresist layer is physically removed (separated) from direct contact with the immersion fluid by the presence of the top-coat layer therebetween. In this manner, some or all of the aforementioned technical problems can be eliminated, avoided or at least their effects advantageously reduced. Further to such problems, such top-coat layer embodiments of the present invention are characterized by exhibiting advantageously high contact angles with aqueous fluids and are thus characterized as being hydrophobic. Such hydrophobicity is believed to be a desirable property for minimizing any chemical or other interactions between a material and an aqueous immersion fluid in contact therewith. Still further, such top-coat embodiments also exhibit high receding angles and low sliding angles (see, FIG. 2) which are believed to also be indicative of such materials having high hydrophobicity and therefore indicative of how such embodiments will dynamically perform during their use as a top-coat or protective layer for an immersion lithographic process. Thus it has been observed that when a top-coat layer exhibiting high contact and receding angles as well as low sliding angles, as compared to other materials, is used during an immersion lithographic process, little or no defectivity due to non-retained immersion fluid is observed over a wide range of scanning speeds. That is to say, such embodiments have excellent scanability.

Some other embodiments in accordance with the present invention, encompass a imagable norbornene-type polymer, having repeating units represented by some or all of Formulae I, II, III, IV, V and VI, shown below. Some embodiments encompass a composition employing such a polymer where such composition is for disposing over a substrate to form an imaging layer or film thereover. Such a composition for forming the imaging layer is also referred to as a photoresist composition or material and the layer formed a photoresist layer or film.

In some imaging layer embodiments in accordance with the present invention, such layer is capable of directly receiving an immersion fluid (or medium) to enable an immersion photolithography process. In other embodiments, such photoresist compositions are employed to form an imaging layer that receives a top-coat composition for forming a top-coat layer thereover.

Advantageously, some photoresist composition embodiments in accordance with the present invention provide imaging layers that are characterized by exhibiting advantageously high contact angles with aqueous fluids and are thus hydrophobic. Such hydrophobicity being believed to be a desirable property for minimizing any chemical or other interactions between a material and an aqueous immersion fluid in contact therewith. Still further, such imaging layer embodiments also exhibit high receding angles and low sliding angles (see, FIG. 2) which are believed to also be indicative of the high hydrophobicity of such materials and therefore indicative of how such embodiments will dynamically perform during their use in an immersion lithographic process. Thus it has been observed that when an imaging layer exhibiting high contact and receding angles as well as low sliding angles, as compared to other materials, is used during an immersion lithographic process, with or without a top-coat layer formed thereover, little or no defectivity due to non-retained immersion fluid can be obtained over a wide range of scanning speeds. That is to say, such embodiments have excellent or high scanability.

In some embodiments in accordance with the present invention a non-self imagable polymer encompassing at least one repeating unit represented by Formula I is provided:

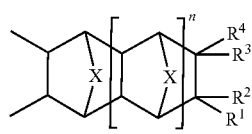

(I)

where X is $-CH_2-$, $-CH_2CH_2-$, O or S; n is an integer from 0 to 5 inclusive; each $R^1$ to $R^4$ independently represents hydrogen, a linear or branched alkyl group, or a linear or branched haloalkyl group, subject to the proviso that at least one of $R^1$ to $R^4$ is a $QNHSO_2R^5$ group where Q is a linear or branched alkyl spacer of 1 to 5 carbons, and $R^5$ is a perhalo group of 1 to about 10 carbon atoms.

Some embodiments in accordance with the present invention encompass a polymer represented by Formula I where, subject to the aforementioned proviso, each of the others of $R^1$ to $R^4$ that are not a $QNHSO_2R^5$ group are independently hydrogen; a linear or branched alkyl or haloalkyl group of, for example from 1 to about 20 carbon atoms, in some embodiments from 1 to about 12 carbon atoms, and in other embodiments from 1 to about 4 carbon atoms.

In some embodiments Q is a linear alkyl spacer of 1 to 3 carbons and $R^5$ contains from 1 to 4 carbon atoms. In other embodiments Q and $R^5$ are each independently 1 or 2 carbon atoms, and in still other embodiments each is 1 carbon atom. Typically the halogen of $R^5$ is selected from F, Br or I. In one exemplary embodiment of the present invention, X is $-CH_2-$, one of $R^1$ to $R^4$ is a $QNHSO_2R^5$ group and the others are each hydrogen, n is 0, Q is $-CH_2-$ and $R^5$ is $-CF_3$. Repeating units in accordance with Formula I are generally for providing the polymer with aqueous alkali solubility.

In some embodiments in accordance with the present invention a non-self imagable polymer encompasses a second type of repeating unit represented by Formula II:

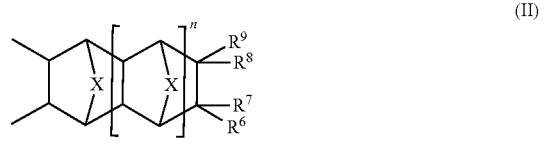

(II)

where X and n are as defined for Formula I and each of $R^6$ to $R^9$ independently represents hydrogen, a linear or branched alkyl group, or a linear or branched haloalkyl group, subject to the proviso that at least one of $R^6$ to $R^9$ is a $-Q^{\ddagger}(CO)O-(CH_2)_m-R^{10}$ group where $Q^{\ddagger}$ is an optional linear or branched alkyl spacer where if present is of 1 to 5 carbons, m is either 0 or an integer from 1 to 3 inclusive; and $R^{10}$ is a linear or branched perhalo alkyl of 1 to 10 carbon atoms.

In some embodiments $Q^{\ddagger}$ is not present or is a linear alkyl spacer of 1 to 3 carbons and $R^{10}$ contains from 1 to 4 carbon atoms. In other embodiments $Q^{\ddagger}$ is not present or is 1 carbon atom and $R^{10}$ contains 1 or 2 carbon atoms, and in still other embodiments $R^{10}$ contains 1 carbon atom. Typically the halogen of $R^{10}$ is selected from F, Br or I. In exemplary embodiments of the present invention encompassing repeating units represented by Formula II, X is $-CH_2-$, one of $R^6$ to $R^9$ is the $-Q^{\ddagger}(CO)O-(CH_2)_n-R^{10}$ group and the others are each hydrogen, n is 0 and m is 1, $Q^{\ddagger}$ is not present and $R^{10}$ is $-C_2F_5$. Repeating units in accordance with Formula II are generally for providing hydrophobicity control to the polymer and are generally used with other of the repeat units defined herein to provide such hydrophobicity control. That is to say that as more of such a repeating unit is incorporated into the polymer, the hydrophobicity of that polymer will generally increase.

In some embodiments in accordance with the present invention a non-self imagable polymer encompasses a type of repeating unit represented by Formula III:

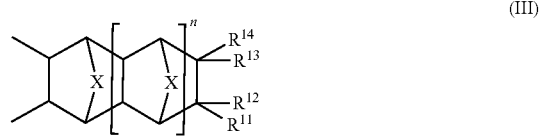

(III)

where X and n are as defined for Formula I and each of $R^{11}$ to $R^{14}$ independently represents hydrogen, a linear or branched alkyl group, or a linear or branched haloalkyl group, subject to the proviso that at least one of $R^{11}$ to $R^{14}$ is one of groups A, B or C:

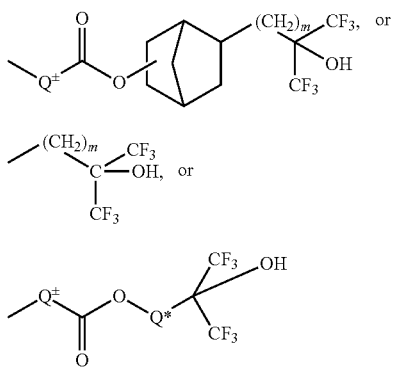

where m is an integer from 1 to 3 inclusive, $Q^{\ddagger}$ is as defined for Formula II and $Q^*$ is a linear or branched alkyl spacer of 1 to 5 carbons.

In some embodiments encompassing groups A or C, $Q^{\ddagger}$ is not present or is a linear alkyl spacer of 1 to 3 carbons and additionally for group C, $Q^*$ is a linear or branched spacer of 3 or 4. In other such embodiments $Q^{\ddagger}$ is not present or is 1 carbon atom. In other embodiments encompassing group B, m is either 1 or 2. In exemplary embodiments of the present invention encompassing repeating units represented by Formula III, X is —CH$_2$—, one of $R^{11}$ to $R^{14}$ is group B and the others are each hydrogen, n is 0 and m is 1. Repeating units in accordance with Formula III are generally for providing the polymer with aqueous alkali solubility and are generally used with other of the repeat units defined herein to provide such aqueous alkali solubility.

In yet other embodiments in accordance with the present invention a non-self imagable polymer encompasses still another type of repeating unit represented by Formula IV:

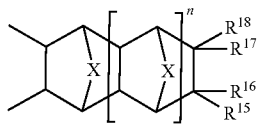

where X and n are as defined for Formula I and each of $R^{15}$ to $R^{18}$ independently represents hydrogen, a linear or branched alkyl group, or a linear or branched haloalkyl group, subject to the proviso that at least one of $R^{15}$ to $R^{18}$ is one of groups D, E or F:

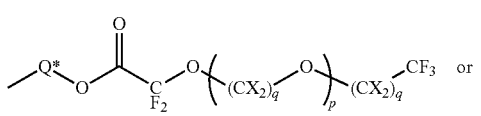

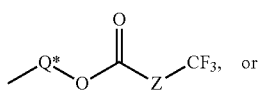

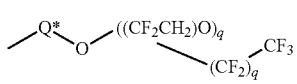

where each X is independently either F or H, each q is independently an integer from 1 to 3, p is an integer from 1 to 5, $Q^*$ is as defined for Formula III, and Z is a linear or branched halo or perhalo spacer of 2 to 10 carbons.

In some embodiments encompassing group D, $Q^*$ is one carbon, X is F, q is 2 or 3 and p is 2. In some embodiments encompassing group E, $Q^*$ is one carbon and Z is a branched fluorinated alkyl chain of up to 9 carbons units. In some embodiments encompassing group F, $Q^*$ is one carbon and q is 1 or 2. Repeating units in accordance with Formula IV are generally for providing hydrophobicity control to the polymer in the same manner as described for Formula II type repeating units.

It should be understood, that top-coat polymer embodiments of the present invention encompass polymers having repeating units represented by Formula I and other types of repeating units, including but not limited to repeating units such as those represented by one or more of Formulae II, III and/or IV. Additionally, some embodiments of the present invention encompass repeat units that are not within the scope and spirit of such formulae. For example, some embodiments encompass linear or branched alkyl substituted repeating units such as those derived from hexyl- or butyl-norbornene. Still other embodiments encompass repeating units derived from a linear or branched alkyl ester norbornene such as isobornyl ester norbornene. These alternate repeating units can be instead of, or in addition to, any of the previously mentioned repeat units that are represented by Formulae II, III or IV.

Where an embodiment in accordance with the present invention encompasses a non-self imagable polymer having more than one distinct type of repeating unit represented by one or more of Formulae I, II, III and/or IV, the molar ratio of such repeating units, where repeating unit (1) is represented by Formula I, and the others of (2) through (m) are independently represented by Formulae II, III or IV, (1):(2): . . . :(m) can be about (30-99):(5-50): . . . :(5-50), where m is an integer representing the last type of distinct repeating unit and generally is 4 or less. In other such embodiments such molar ratio can be about (50-80):(5-30): . . . :(5-30). It will of course be understood that for such ratios, the total cannot exceed 100. While where an embodiment encompasses Formula I type of repeat units and types of repeat units such as those represented by one of Formulae II, III or IV, the mole percent (mol %) of the Formula I type of repeat unit is generally from 40 to 99 mol % and a sufficient amount of one or more of other types of repeat units are provided to provide 100 mol % of polymer. For top-coat polymer embodiments of the present invention having only Formulae I and II types of repeat units, the Formula I type can range generally from 40 to 99 mol % and for some embodiments from 60 to 90 mol %. For other exemplary embodiments, such as polymers having types of repeating units represented by one or both of Formulae III and IV in addition to types represented by Formulae I and/or II, the mol % of Formula I type of repeating units is typically from about 40 to about 98 mol %, a Formula II type (if present) from about 1 to about 20 mol % and independently, each of the Formula III and IV types of repeating units, if present, from about 1 to about 40 mol %. It should of course be understood that other polymer compositions having greater or lesser amounts of any particular type of repeat unit are also considered to be within the scope and spirit of the present invention. As will be discussed more fully below, the final formulation of a top-coat polymer is the result of certain design choices that are dictated by the manner in which a top-coat layer, formed from such a polymer, will be used.

It should further be noted that the specific amount of any particular repeating unit present within the polymer is the result of a "polymer design" process. That is to say, a repeat unit's physical and chemical properties are determined, often by forming a homopolymer thereof, and such physical and chemical properties compared to the desired properties of the layer to be formed. Based upon this comparison, one or more other repeat units are selected and test compositions of such polymers made and in turn formed into layers where physical and chemical properties are determined. As a non-limiting example of such a polymer design process, homopolymers of several norbornene-type monomers are formed and then cast into films for which contact and sliding angle measurements are made. Based on the measurements from the aforementioned homopolymers, a polymer having two or more types of repeating units can be formed having a high contact angle and a low sliding angle and/or desirable dissolution rate in an aqueous base solution such as 0.26N TMAH.

Some embodiments in accordance with the present invention are imagable norbornene-type polymers useful in the forming of photoresist compositions. That is to say that unlike the embodiments useful for forming a top-coat layer, discussed above, polymers for inclusion in a photoresist composition are imagable. While some such embodiments in accordance with the present invention encompass three or four distinct types of repeating units, it will be understood that others encompass either a larger or smaller number of types of repeating units. Advantageously, some types of repeating units useful for imagable polymers, are those represented by Formulae I-IV described above with respect to non-self imagable polymers. Other useful types of repeating units, for providing the imaging capability of such imagable polymers, are represented by Formulae V and VI defined below:

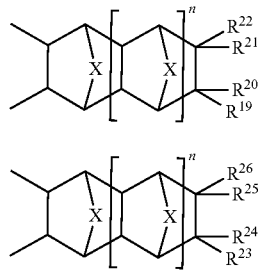

(V)

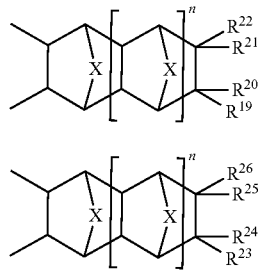

(VI)

where in Formula V: X, n are as defined for Formula I and each of $R^{19}$ to $R^{22}$ independently represents hydrogen, a linear or branched alkyl group, or a linear or branched haloalkyl group, but with the proviso that least one of $R^{19}$ to $R^{22}$ is a group represented by the formula:

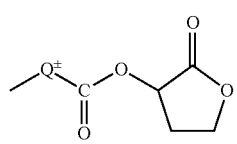

G where $Q^{\ddagger}$ is an optional linear or branched alkyl spacer where if present is of 1 to 5 carbons. In some other embodiments the others of $R^{19}$ to $R^{22}$ are each hydrogen and $Q^{\ddagger}$ is not present or is a linear alkyl spacer of 1 to 3 carbons. In still other embodiments the others of $R^{19}$ to $R^{22}$ are each hydrogen and $Q^{\ddagger}$ is not present or is 1 carbon atom and in yet still other embodiments, the others of $R^{19}$ to $R^{22}$ are each hydrogen and $Q^{\ddagger}$ is not present. Repeating units in accordance with Formula V are generally for providing the polymer with hydrophilic properties. Unlike a top-coat or protecting layer, a photoresist layer's performance is generally enhanced when a layer's hydrophilicity or wettability is increased.

And in Formula VI, X, n are as defined for Formula I and each of $R^{23}$ to $R^{26}$ independently represents hydrogen, a linear or branched alkyl group, or a linear or branched haloalkyl group, but with the proviso that least one of $R^{23}$ to $R^{26}$ is a group represented by one of H, J or K shown below:

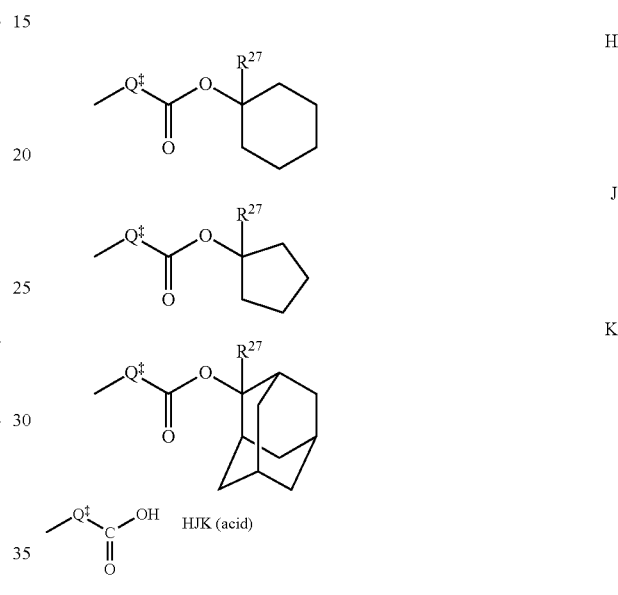

where $Q^{\ddagger}$ is as defined above and $R^{27}$ is a linear or branched alkyl group of 1 to about 5 carbon atoms. It should be noted that the HJK(acid) group represented above, is derived froth one of the H, J or K groups. That is to say that some portion of the repeating units represented by Formula VI, and therefore having at least one H, J or K group thereon, are converted to an HJK(acid) group, generally after the polymerization is complete and during the isolation of the resulting polymer. Therefore, for embodiments in accordance with the present invention that include repeating units represented by Formula VI, generally some small portion of those units will have the HJK(acid) group while the majority of such units will have one of the H, J or K groups. Such portion will be referred to as being represented by Formula VI(acid) to distinguish it from repeat units represented by Formula VI. Repeating units in accordance with Formula VI provide the polymer with an acid labile functional group that can form an acidic group upon interaction with a PAG, in an exposed region of the photoresist layer, to increase the aqueous alkali solubility of such exposed region. Having such acid labile group containing repeat units in the polymer chain, provide for chemical amplification, such as is generally known.

The imagable polymer embodiments in accordance with the present invention described above, thus relate to norbornene-type polymers useful for forming a photoresist composition, which in turn is useful for forming a photoresist layer. In some such embodiments, the photoresist layer formed is suitable for direct contact with an immersion medium during an immersion lithographic process. That is to say that such an imaging layer has high contact and receding angles and a low sliding angle. In other embodiments, the imagable layer is best suited for underlying a protective layer during an immersion lithographic process and exhibits little or no intermixing region with such protective layer forming composition. Advantageously, some embodiments of the present invention include a imagable polymer embodiment that is useful for forming a photoresist layer suitable for receiving a top-coat layer formed using a top-coat composition of the present invention.

Where an embodiment in accordance with the present invention encompasses an imagable polymer having more than one distinct type of repeating unit represented by one or more of Formulae I, II, III, IV, V, VI and/or VI(acid), the molar ratio of such repeating units, where repeating unit (1) is represented by Formula I, repeating unit (2) is represented by Formula V, repeating unit (3) is represented by Formula VI and the others of (4) through (m) are independently represented by Formulae VI(acid), II, III, or IV, the molar ratio of a polymer encompassing repeat units (1):(2):(3):(4): . . . (m) can be about (0-60):(5-60):(5-80):(0-15):(0-50) . . . :(0-50), where m is an integer representing the last type of distinct repeating unit and generally is 5 or less. In other such embodiments such molar ratio can be about (5-40):(10-50):(20-70):(1-10):(0-40): . . . :(0-40). It will of course be understood that for such ratios, the total cannot exceed 100. For imagable polymer embodiments of the present invention having Formulae I, V and VI types of repeat units, the Formula I type can range generally from 1 to 50 mol % and for some embodiments from 10 to 40 mol %, the Formula V type from 1 to 50 mol % and for some embodiments from 10 to 40 mol %, and the Formula VI type from 20 to 75 mol % and for some embodiments from 30 to 50 mol %. It should be noted that where Formula VI type of repeat units are present, generally an amount of Formula VI(acid) type repeat units are also present, where the amount of such Formula VI(acid) type generally reduces the amount of Formula VI type. Typically the Amount of Formula VI (acid) type is less than 10 mol %. It should of course be understood that other polymer compositions having greater or lesser amounts of any particular type of repeat unit are also considered to be within the scope and spirit of the present invention. As will be discussed more fully below, the final formulation of a top-coat polymer is the result of certain design choices that are dictated by the manner in which a top-coat layer, formed from such a polymer, will be used.

Monomers and Polymerizations

The foregoing non-self imagable polymers, as well as imagable polymers, represented by any one or more types of repeating units represented by one or more appropriate Formulae I, II, III, IV, V and or VI, are typically derived from appropriate analogous monomers. Thus, by way of a non-limiting example, where a repeating unit such as:

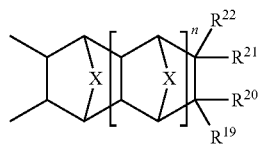

(V)

is desired, the analogous monomer, shown below, can be employed in the forming of the polymer:

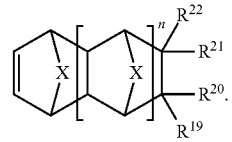

(VA)

Thus, where a polymer having a first type of repeating unit represented by Formula I and a second type of repeating unit represented by Formulae II, III, IV or V is desired, such polymer can be prepared by addition polymerization (2, 3 enchainment) of appropriate, analogous monomers of the desired repeating units; where such addition polymerizations is carried out in the presence of a single or multi-component Group VIII transition metal catalyst.

Where a multi-component catalyst is desired, such can be prepared in situ by combining a procatalyst with a cocatalyst (or activator) in the presence of the monomer(s) to be polymerized. By procatalyst is meant a Group VIII transition metal (generally palladium) containing compound that is converted to an active catalyst by a reaction with a cocatalyst or activator compound. The description and synthesis of representative procatalysts and cocatalysts, as well as cationic Pd(II) catalysts formed there using, are known. For example, as set forth in U.S. Pat. No. 6,455,650, which is incorporated, in pertinent part, herein by reference. Where a single component catalyst is desired, such catalysts are (and some additional multi-component catalyst systems) set forth in published U.S. Patent Application No. 20050187398, which is incorporated, in pertinent part, herein by reference. The catalyst systems of such referential documents are briefly described below, however, it will be understood that such descriptions provided herein are non-limiting examples and hence are not all encompassing. A more complete description of such catalyst systems is provided by the above-referenced documents.

Palladium procatalysts suitable for the polymerization of the monomers of the present invention are represented by Formula A, below:

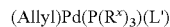

(A)

where $R^x$ may be isopropyl or cyclohexyl; and L' may be trifluoroacetate or trifluoromethanesulfonate (triflate). Representative procatalyst compounds in accordance with such formula include, but are not limited to, (allyl)palladium-(tricyclohexylphosphine)triflate, (allyl)palladium (triisopropylphosphine) triflate, (allyl) palladium (tricyclohexylphosphine)trifluoroacetate, and (allyl)palladium (triisopropylphosphine)trifluoroacetate.

Other suitable procatalysts are described in the aforementioned '650 patent encompass a palladium metal cation and a weakly coordinating anion as represented by Formula B shown below:

(B)

where $E(R)_3$ represents a Group 15 neutral electron donor ligand where E is selected from a Group 15 element of the Periodic Table of the Elements, and R independently represents hydrogen (or one of its isotopes), or an anionic hydrocarbyl (and its deutero versions) containing moiety; Q is an anionic ligand selected from a carboxylate, thiocarboxylate, and dithiocarboxylate group; LB is a Lewis base; WCA represents a weakly coordinating anion; a represents an integer of 1 or 2; and b represents an integer of 1 or 2 where the sum of a+b is 3.

Suitable single component catalysts are described in the aforementioned published application and are represented by Formulae B' and C, below:

$$[(E(R)_3)_aPd(Q)(LB)_b]_p[WCA]_r \quad (B')$$

$$[(E(R)_3)(E(R)_2R^*)Pd(LB)]_p[WCA]_r \quad (C)$$

In Formula B', E, R, E(R)$_3$; Q; LB and WCA are as defined above for Formula B, but where a represents an integer of 1, 2, or, 3; b represents an integer of 0, 1, or 2, where the sum of a+b is 1, 2, or 3; and p and r are integers that represent the number of times the palladium cation and the weakly coordinating anion are taken to balance the electronic charge on the structure of Formula B'. In an exemplary embodiment, p and r are independently selected from an integer of 1 and 2.

In Formula C, E(R$_3$) is as defined for Formula B'; E(R)$_2$R* also represents a Group 15 neutral electron donor ligand where E, R, r and p are defined as above and where R* is an anionic hydrocarbyl containing moiety, bonded to the Pd and having a β hydrogen with respect to the Pd center. In an exemplary embodiment, p and r are independently selected from an integer of 1 and 2. While such single component catalysts systems can advantageously be employed without the addition of a cocatalyst (that is to say as a latent catalyst activated only by the addition of energy, for example by heating), typically where such single component catalysts are used for a solution polymerization, the addition of an amount of cocatalyst is often desirable.

Representative cocatalyst compounds include, among others, lithium tetrakis(pentafluorophenyl)borate diethyl etherate (LiFABA) and N-dimethylanilinium tetrakis-(pentafluorophenyl)borate (DANFABA). Other suitable activator compounds are also described in the aforementioned '650 patent.

In accordance with some multi-component catalyst embodiments of the present invention, monomer to catalyst to cocatalyst molar ratios can range from about 500:1:5 to about 20,000:1:5 or from 500:1:1 to 20,000:1:1. In some such embodiments, molar ratios are from about 5,000:1:4 to about 1,000:1:2, and in still other such embodiments, molar ratios of from about 3,000:1:3 to about 1,000:1:2 are advantageous. It should be recognized that appropriate molar ratios can and will vary depending, among other things, on the activity of a particular catalyst system, the reactivity of the monomer selected, and molecular weight of the resulting polymer that is desired. In addition, for embodiments of the present invention where single component catalysts are employed, the addition of a cocatalyst can be eliminated. However, generally a ratio of from about 5,000:1:4 to about 5000:1:2, and in particular of about 2000:1:3 to about 1000:1:3 have been found useful.

Suitable polymerization solvents for the addition polymerization reactions include aliphatic and aromatic solvents. These include aliphatic (non-polar) hydrocarbons such as pentane, hexane, heptane, octane and cyclohexane; halogenated alkane solvents such as dichloromethane, chloroform, carbon tetrachloride, ethyl chloride, 1,1-dichloroethane, 1,2-dichloroethane, 1-chloropropane, 2-chloropropane, 1-chlorobutane, 2-chlorobutane; 1-chloro-2-methylpropane, and 1-chloropentane; esters such as ethylacetate, i-amyl acetate; ethers such as diethylether; aromatic solvents such as benzene, toluene, o-, m-, and p-xylene, mesitylene, chlorobenzene, o-dichlorobenzene, Freon® 112 halocarbon solvent, fluorobenzene, o-difluorobenzene, p-difluorobenzene, pentafluorobenzene, hexafluorobenzene, and o-dichlorobenzene. Water may be used as the solvent. Other organic solvents such as diethyl ether, tetrahydrofuran, acetates (e.g., ethyl acetate), esters, lactones, ketones and amides may be useful. Mixtures of two or more of the aforementioned solvents may be useful.

In a solution process, the polymerization reaction may be carried out by adding a solution of the preformed catalyst or individual catalyst components to a solution of the norbornene-type monomer or mixtures of monomers to be polymerized. In some embodiments, the amount of monomer dissolved in the solvent ranges from about 5 to about 50 weight percent (wt %), and in other embodiments from about 10 to about 30 wt %, and in still other embodiments from about 10 to about 20 wt %. After the preformed catalyst or catalyst components are added to the monomer solution, the reaction medium is agitated (e.g. stirred) to ensure complete mixing of catalyst and monomer components and is generally heated for a period of time adequate for the polymerization.

While the reaction temperature of the polymerization reaction can range from about 0° C. to about 150° C., generally temperatures from about 10° C. to about 100° C., or even from about 20° C. to about 80° C. have been found to be advantageous.

In top-coat polymer embodiments of the invention, a desired average molecular weight (Mw) of the polymers is from about 3000 to about 200,000. In other embodiments, Mw is from about 3500 to about 50,000 and in still other embodiments from about 4000 to 10,000. In photoresist polymer embodiments of the invention, a desired Mw of the polymers is from about 2000 to about 50,000. In other embodiments, Mw is from about 2500 to about 35,000 and in still other embodiments from about 3000 to 10000. However, it should be understood that other embodiments in accordance with the present invention encompass top-coat and photoresist polymers having other average molecular weight ranges, and that such polymers can have either a higher or lower Mw that is provided with the exemplary Mw ranges above. Thus such other Mw ranges will be understood to be within the scope and spirit of the present invention. Further to the Mw ranges provided above, it will be noted that Mw for any polymer referred to herein is measured using gel permeation chromatograph (GPC) with an appropriate standard, unless otherwise noted.

Polymer Compositions

Some embodiments in accordance with the present invention encompass compositions of either the top-coat polymer embodiments or photoresist polymer embodiments previously discussed, where such compositions can incorporate an appropriate polymer having any of the appropriate repeating units in the molar ratios and $M_w$ ranges previously disclosed. Such compositions are useful for forming a film overlaying a substrate as will be discussed in more detail below. Such compositions will encompass an appropriate polymer, a solvent and one or more additional components (additives) that are selected to provide for the forming of a film over a substrate, e.g. a semiconductor substrate, and/or enabling the desired performance of such a film during an immersion lithographic process.

Referring first to embodiments of the present invention that are compositions encompassing a top-coat polymer, such compositions encompass appropriate amounts of one or more distinct top-coat polymers, such as described above, an organic solvent and optionally, one or more of an acidic material, a cross-linking material and a surfactant.

Useful organic solvents for a top-coat composition are solvents capable of dissolving the polymer while not being miscible with a photoresist film previously formed on a substrate. Such solvents generally includes alcoholic solvents having from 1 to 10 carbon atoms, partially or wholly-fluorinated alcoholic solvents having from 1 to 10 carbon atoms, partially or wholly-fluorinated alkyl ether solvents having from 4 to 15 carbon atoms, and partially or wholly-fluorinated alkyl ester solvents having from 4 to 15 carbon atoms. Exemplary solvents in accordance with the above criteria are n-butyl alcohol, isobutyl alcohol, n-pentanol, 4-methyl-2-pentanol, 2-octanol, 2-perfluorobutyl ethanol ($C_4F_9CH_2CH_2OH$), perfluoropropyl methanol (($C_3F_7$)($CH_2OH$)), $H(CF_2)_2CH_2$—O—($CF_2)_2$—H, $H(CF_2)_7$—(CO)O—$CH_3$ and $H(CF_2)_4$—(CO)O—$C_2H_5$.

Optionally, top-coat composition embodiments of the present invention can include an acidic compound. Advantageously, such an acid compound can, if present, serve as a "post-exposure delay" protective agent. That is to say, should there be a delay in the timing between the imagewise exposure of an underlying photoresist film and the development of the formed image, such acid compound can serve to provide protection against the effect of any atmospheric amines or amine-containing materials that may be present. Such protection being afforded by the acidic compound reacting with any such atmospheric amines to neutralize them before such amines can interact with the exposed photoresist film to result in miss-patterning of the photoresist film during a delayed, subsequent development process. Thus by including an optional acidic compound in the top-coat composition, it may be possible to reduce or eliminate any significant dimensional fluctuation of the photoresist pattern resulting from the presence of atmospheric amines or amine-containing compounds.

Useful acidic compounds are those represented in the Formulae shown below:

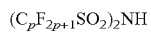   X where p is an integer of from 1 to 5,

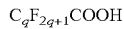   XI where q is an integer of from 10 to 15,

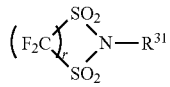   XII where r is an integer of 2 or 3, $R^{31}$ represents hydrogen or an alkyl group partially or wholly substituted with fluorine atoms, such alkyl group further being optionally substituted with any of a hydroxyl group, an alkoxy group, a carboxyl group and an amino group.

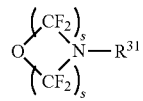   XIII where s is an integer of 2 or 3, and $R^{31}$ is as defined above.

Exemplary acidic compounds are $(C_4F_9SO_2)_2NH$, $(C_3F_7SO_2)_2NH$, $C_{10}F_{21}COOH$,

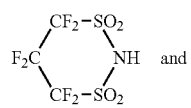 and   XIIa

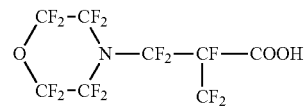   XIIb

In some top-coat composition embodiments of the present invention, an optional crosslinking agent is added. Such optional crosslinking agents are generally a nitrogen-containing compound which has an amino group and/or an imino group and in which at least two hydrogen atoms are substituted with a hydroxyalkyl group and/or an alkoxyalkyl group. Such agents include, but are not limited to, melamine derivatives, urea derivatives, guanamine derivatives, acetoguanamine derivatives, benzoguanamine derivatives and succinylamide derivatives in which the hydrogen atom of the amino group is substituted with a methylol group or an alkoxymethyl group or with both of the two; as well as glycoluryl derivatives and ethylene-urea derivatives in which the hydrogen atom of the imino group is substituted. An exemplary crosslinking agent is tetrabutoxy methylated glycoluryl.

These nitrogen-containing compounds may be obtained, for example, by reacting a melamine derivatives, an urea derivative, a guanamine derivative, an acetoguanamine derivative, a benzo-guanamine derivative, a succinylamide derivative, a glycoluryl derivative or an ethylene-urea derivative with formalin in boiling water to thereby methylate the derivative, or by further reacting it with a lower alcohol, concretely methanol, ethanol, n-propanol, isopropanol, n-butanol or isobutanol to thereby alkoxylate it. One exemplary crosslinking agent found useful is tetrabutoxy methylated glycoluryl.

Other crosslinking agents have also been found useful. For example a condensation product of at least one type of a hydrocarbon compound substituted with a hydroxyl group and/or an alkoxy group, and a monohydroxy-monocarboxylic acid compound is also included. Exemplary condensation products include monohydroxy-monocarboxylic acids in which the hydroxyl group and the carboxyl group are bonded to either a single carbon atom or to adjacent carbon atoms.

If desired, the protective film-forming composition in accordance with embodiments of the invention can further contain an optional surfactant added thereto. One exemplary surfactant is XR-104 (trade name by Dainippon Ink and Chemicals, Inc.), to which, however, the invention should not be limited. Adding the surfactant to the material makes it possible to further improve the coatability of the material and the ability thereof to provide for a more uniform application of the top-coat or protective film. This increased uniformity being the result of suppressed unevenness in the film.

Top-coat composition embodiments of the present invention are employed for forming top-coat or protective-layer films overlying a photoresist film formed on a substrate. Such films are generally for receiving an immersion fluid such as is employed in an immersion lithographic process. Generally the thickness of such a top-coat film, in some embodiments, is from about 70 nm to about 200 nm, while in other embodiments from about 90 nm to about 180 nm and in still other embodiments, from about 120 nm to about 160 nm. It will be understood, however, that other film thicknesses, greater than or less than the ranges provided above are also useful and thus are within the scope and spirit of the embodiments of the present invention. It will also be understood, that obtaining any particular film thickness from the appropriate use of a top-coat composition of the present invention is dependent on the method of coating employed as well as the amount of top-coat polymer, and of any optional additives present, within such a composition. Where a spin coating method is used (described more fully below) it is found that for some embodiments a desirable range of the amount of top-coat polymer is from about 0.1 weight percent (wt %) to about 30 wt %, while in other embodiments such amount is from about 0.3 wt % to about 15 wt % and in still other embodiments from about 0.5 wt % to about 7.5 wt % is desirable. Such values of wt % being with respect to the total amount (weight) of such top-coat composition. It will be understood, however, that ranges for the amount of top-coat polymer, greater than or less than the ranges provided above are also useful and thus are within the scope and spirit of the embodiments of the present invention.

When an optional surfactant is added to such a top-coat composition, some embodiments employ a range of such surfactant of from about 0.001 wt % to about 10 wt %, other embodiments from about 0.01 wt % to about 1 wt %, and still other embodiments from about 0.05 wt % to about 0.5 wt %, such amounts being with respect to the amount of top-coat polymer in such a composition. When an optional crosslinking agent is added to such a top-coat composition, some embodiments employ a range of such agent of from about 0.5 wt % to about 10 wt %, other embodiments from about 1 wt % to about 8 wt %, and still other embodiments from about 3 wt % to about 7 wt %, such amounts being with respect to the amount of top-coat polymer in such a composition. And when an optional acidic compound is added to such a top-coat composition, some embodiments employ a range of such acidic compound of from about 0.1 wt % to about 10 wt %, other embodiments from about 0.2 wt % to about 5 wt %, and still other embodiments from about 0.3 wt % to about 1 wt %, such amounts being with respect to the amount of top-coat polymer in such a composition.

Referring now to embodiments of the present invention that are compositions encompassing a imagable or photoresist polymer, such compositions encompass appropriate amounts of one or more of the previously discussed photoresist or imagable polymers, an organic solvent, a photoacid generator material and optionally, an amine material and one or more of a group of miscible additives (described more fully below). Further, such embodiments are positive acting ("positive tone" or "positive type") photoresist compositions. That is to say, that after an imagewise exposure of a layer of such a composition formed on a substrate, that the pattern formed is the result of exposed regions of the layer being removed, or "developed-out" to leave only non-exposed regions of the layer over the substrate.

Advantageous solvents for the photoresist composition embodiments of the present invention are selected for their ability to provide a solution of the polymer as well as any of the aforementioned additives that is suitable for casting a film of such composition over a substrate. Any of the exemplary solvents listed below, taken alone or in any combination thereof, or any one or more solvents not listed below but which are known to skilled artisans as being used for conventional chemically amplified resists, are within the scope and spirit of photoresist composition embodiments of the present invention.

Exemplary solvents are generally organic solvents that include ketones, such as acetone, methyl ethyl ketone, cyclohexanone, methyl isoamyl ketone and 2-heptanone; polyhydric alcohols and derivatives thereof, such as ethylene glycol, ethylene glycol monoacetate, diethylene glycol, diethylene glycol monoacetate, propylene glycol, propylene glycol monoacetate, dipropylene glycol, or the monomethyl ether, monoethyl ether, monopropyl ether, monobutyl ether or monophenyl ether of dipropylene glycol monoacetate; cyclic ethers such as dioxane; and esters such as methyl lactate, ethyl lactate, methyl acetate, ethyl acetate, butyl acetate, methyl pyruvate, ethyl pyruvate, methyl methoxypropionate, and ethyl ethoxypropionate. As mentioned above, the exemplary solvents can be used singularly, or as a mixed solvent having two or more different, individual solvents. Where mixed solvents are employed, mixed solvents of propylene glycol monomethyl ether acetate and a lactate ester have been found to be advantageous in general and specifically where a mixture ratio of from about 8:2 to 2:8 (by mass), respectively is employed.

In some photoresist composition embodiments, a mixed solvent containing at least one of propylene glycol monomethyl ether acetate (PGMEA) and ethyl lactate (EL), together with γ-butyrolactone (GBL) as the organic solvent has been found advantageous. In such a case, the mass ratio of the former and latter components of such a mixed solvent is from about 70:30 to about 95:5. Where both PGMEA and EL are employed, a mass ratio of from 50:50 to about 90:10 is useful.

To enable this imageability of such positive type resist compositions, a photoacid acid generator (PAG) component is provided. Such a component generates an acid on exposure to an appropriate energy source, e.g. ultra violet radiation having a peak wavelength at 193 nm (ArF excimer laser) or 157 nm ($F_2$ excimer laser). The generated acid then causes the deprotection of protected pendent groups of some of the repeat units of the resin to result in an increase in the dissolution rate within such exposed area with respect to the dissolution rate within an unexposed area. Useful PAG components can be appropriately selected from any of the known materials used as photoacid generators in conventional chemically amplified resists. Exemplary PAGs include, but are not limited to, onium salts such as (4-methoxyphenyl) phenyliodonium trifluoromethanesulfonate, bis(p-tert-butylphenyl)iodonium trifluoromethanesulfonate, triphenylsulfonium trifluoromethanesulfonate, (4-methoxyphenyl) diphenylsulfonium trifluoromethanesulfonate, (p-tert-butylphenyl) diphenylsulfonium trifluoromethanesulfonate, diphenyliodonium nonafluorobutanesulfonate, bis(p-tert-butylphenyl) iodonium nonafluorobutanesulfonate, triphenylsulfonium nonafluorobutanesulfonate and diphenyliodonium trifluoromethanephosphate.

It will be understood that the photoacid generator component of a photoresist composition in accordance with the present invention can utilize a single PAG, or a combination of two or more PAGs. Further, an appropriate amount of such PAG(s) incorporated into some photoresist compositions is typically from about 0.5 to about 30 wt %, while in other such compositions from about 1 to about 10 wt % is employed. Generally, if the quantity of the PAG component is less than about 0.5 wt %, the image formation in an exposed layer is problematic, whereas if the quantity exceeds about 30 wt %, achieving a uniform solution becomes difficult, and can cause deterioration in the storage stability of such compositions.

In some photoresist embodiments of the present invention, an optional amine additive can be employed. Such an amine additive has been found to sometimes improve the resist pattern shape and the long term stability (the post exposure stability of the latent image formed by the imagewise exposure of the resist layer) within the photoresist layer. Generally a lower aliphatic secondary or tertiary amine is added. By lower aliphatic amine is meant an alkyl amine or an alkyl alcohol amine of no more than 5 carbon atoms. Exemplary amines include, but are not limited to, trimethylamine, diethylamine, triethylamine, di-n-propylamine, tri-n-propylamine, tripentylamine, diethanolamine and triethanolamine. It has been found that trialkanolamines are often advantageous. As was seen with regard to solvents and PAGs, optional amine components can be a single amine or any appropriate combination of two or more amines. Generally, when used, such optional amine additives are present within a range from about 0.01 to 5 wt % in some embodiments, while in other embodiments from about 0.01 to 2 wt %, such amounts relative to the quantity of the polymer.

In some embodiments of the present invention, other optional additives are employed. All such optional additives are miscible and are selected for being included into a composition according to need. That is to say, for improving certain of the properties of the composition or of the resulting layer. Exemplary optional, miscible additives include, but are not limited to, surfactants for improving the ease of application, dissolution inhibitors, plasticizers, stabilizers, colorants and halation prevention agents.

Immersion Lithographic Processes

Some immersion lithographic process embodiments in accordance with the present invention use previously described imagable polymer composition embodiments (photoresist compositions) for forming a imagable layer overlying a substrate, for example a semiconductor substrate. In such embodiments, a photoresist composition is first applied to the surface of a substrate such as a silicon wafer using a spinner to form a photoresist layer having a first desired thickness. The layer is then prebaked and imagewise exposed, for example using ArF excimer laser (193 nm) through a desired mask pattern. After exposure, the layer is post exposure baked (PEB) and then after cooling, the image is developed using an alkali developing liquid. Generally the prebake is at from about 70° C. to about 140° C. for about 40 to about 120 seconds, and in some embodiments for about 60 to about 90 seconds (sec). PEB is generally conducted using the same or similar times and temperatures to the prebake process. The alkali developing liquid is generally a 0.1 to 10 wt % aqueous solution of tetramethylammonium hydroxide (TMAH) and typically a 0.26N TMAH solution. In this manner, a resist pattern faithful to the mask pattern is obtained.

Furthermore, while ArF excimer lasers are found advantageous for the imaging of the photoresist layers formed from imagable polymer compositions of the present invention, it should be noted that other types of radiation are also effective for forming patterned photoresist layers. For example, longer wavelengths such as 365 nm and shorter wavelengths such as obtained from $F_2$ lasers, EUV (extreme ultraviolet radiation) sources, VUV (vacuum ultraviolet radiation) sources, electron beams, X-rays and soft X-rays can also be effectively used In some image forming process embodiments of the present invention, previously described top-coat polymer composition embodiments are used to form a protective layer over a previously formed photoresist layer before such layer is imagewise exposed. Generally for such embodiments, after casting the photoresist layer over the substrate and the prebake of such layer, a top-coat composition is second applied over the photoresist layer using a spinner to form a top-coat layer thereon, such top-coat layer having a second desired thickness. After the top-coat layer is cast, it is prebaked in an analogous manner to that described above for the photoresist layer. After the top-coat layer is prebaked, the underlying photo-resist layer is imagewise exposed as previously described and then subjected to PEB and image development. Advantageously, the top-coat layers of the present invention are soluble in the aqueous alkali developer solutions used. Therefore, upon exposure to such a solution, the top-coat layer is readily removed to completely present the photoresist layer to the developer solution. In this manner a resist pattern faithful to the mask pattern is obtained without the need for a separate top-coat removal step. It should be noted that top-coat layer forming compositions of the present invention are suitable for use with any appropriate photoresist material, where by appropriate it is meant a material that exhibits little or no intermixing with the protective layer forming composition.

The following description of a lithographic system, which may be used with the foregoing top-coat compositions and/or photoresist compositions as each are formed, is presented in the exemplary context of fabricating a plurality of integrated circuits (IC) formed on/in a semiconductor substrate (wafer). Exemplary ICs include general purpose microprocessors made from thousands or millions of transistors, dynamic, static or flash memory arrays or any other dedicated circuitry. However, one skilled in the art will appreciate that the methods and devices described herein can also be applied to the fabrication of any article manufactured using lithography, such as micro-machines, disk drive heads, gene chips, micro electro-mechanical systems (MEMS), and the like.

An exemplary IC processing arrangement can include an immersion lithographic system used to image a pattern onto a wafer or a region of the wafer. A photoresist composition or imaging layer overlies the wafer. The lithographic system may be, for example, a step-and-repeat exposure system or a step-and-scan exposure system, but is not limited to these exemplary systems. The lithographic system can include a light source and lens array or structure for directing light energy towards a mask (sometimes referred to as a reticle) and then to the imaging layer over the substrate. While the light energy typically has a wavelength of 193 nm, other wavelengths, such as 157 nm or 248 nm can also be employed.

The mask selectively blocks light energy such that a light energy pattern defined by the mask is transferred towards the wafer. An imaging subsystem, such as a stepper assembly or a scanner assembly, sequentially directs the energy pattern transmitted by the mask to a series of desired locations on the wafer. The imaging subsystem may include a series of lenses and/or reflectors for use in scaling and directing the energy pattern towards the wafer in the form of an imaging (or exposure) light energy pattern.

The imaging pattern (or exposure pattern) is transmitted by the imaging subsystem through an immersion medium, that will generally have a relatively high index of refraction (e.g., an index of refraction greater than 1 but less than the index of the imaging layer). The immersion medium is generally a liquid. In one example, purified de-ionized water is used in conjunction with a 193 nm light source (e.g., an argon fluorine (ArF) laser).

The top-coat composition embodiments in accordance with the present invention can be used in forming a top-coat layer overlying a photoresist imaging layer. Such a top-coat layer receives the immersion material and prevents or inhibits ingress of such immersion medium, or components thereof, into the underlying imaging layer. In this manner deleterious effects in imaging can be prevented or at least inhibited. Such deleterious effects are effects that result from the aforementioned problems.

The photoresist composition embodiments in accordance with the present invention can be used in forming a photoresist layer overlying a substrate. Such a photoresist layer can advantageously receive the immersion medium directly, as its hydrophobicity is believed to be sufficiently high to prevent or inhibit ingress of such immersion medium, or components thereof. In this manner deleterious effects in imaging can be prevented or at least inhibited. Such deleterious effects are effects that result from the aforementioned problems. It should be noted, that in some process embodiments in accordance with the present invention, photoresist composition embodiments of the present invention are used for forming a photoresist layer overlying a substrate and top-coat composition embodiments are used to form a top-coat layer overlying the previously formed photoresist imaging layer.

Thus, in some embodiments in accordance with the present invention, a process for generating an image on a substrate encompasses: (a) first coating a substrate with a photoresist composition to form an imaging layer thereon; (b) second coating a substrate with a top-coat composition in accordance with the present invention to form a top-coat layer overlying the imaging layer; (c) imagewise exposing the substrate and overlying layers to appropriate radiation; and (d) developing an image. While in other embodiments the aforementioned first coating employs a photoresist composition in accordance with the present invention and does not include a second coating, and in still other embodiments, both the first coating and the second coating employ appropriate compositions of the present invention. It should be further noted that for step (a), above, the photoresist composition can be essentially any composition that when formed into a layer, has essentially no interaction with the top-coat polymer or the solvent used to form the castable composition thereof.

For each of the above described processes, the first coating involves coating the substrate with a film encompassing a photoresist composition. Suitable substrates encompass silicon, ceramics, polymer or the like. Suitable photoresist compositions can be those in accordance with the present invention, that is to say compositions that encompass a polymeric material embodiment of the present invention, as well as other photoresist compositions. The second coating, if performed, serves to overlay the imaging layer with a film formed from a top-coat composition in accordance with the present invention. Such top-coat layer or film being typically formed in a manner analogous to the forming of the photoresist layer. Imagewise exposing encompasses, exposing selected portions of the imaging or photoresist layer to appropriate radiation Finally, developing the image encompasses first removing any top-coat layer that may have been formed and then development of the image created by the imagewise exposure. Since any top-coat layer formed using a top-coat composition in accordance with the present invention is soluble in aqueous base type solvents such as are also used for developing images in typical imaging layers, embodiments of the present invention can utilize the same solvent for both top-coat removal and image developing. In some embodiments, a unitary process can be employed for both top-coat removal and image development. Suitable solvents include aqueous base solutions, for example, an aqueous base without metal ions, such as tetramethylammonium hydroxide or choline.

The present invention also relates to an integrated circuit assembly such as an integrated circuit chip, multichip module, or circuit board made by the process of the present invention. The integrated circuit assembly encompasses a circuit formed on a substrate by any of the coating, exposing and developing processes described above.

After the substrate has been exposed, developed and etched, circuit patterns can be formed in the exposed areas by coating the substrate with a conductive material such as conductive metals by art known techniques such as evaporation, sputtering, plating, chemical vapor deposition, or laser induced deposition. The surface of the film can be milled to remove any excess conductive material. Dielectric materials may also be deposited by similar techniques during the process of making circuits. Inorganic ions such as boron, phosphorous, or arsenic can be implanted in the substrate in the process for making p or n doped circuit transistors. Other techniques for forming circuits are well known to those skilled in the art.

Photoresist layers and/or top-coat layers employing compositions in accordance with the present invention can formed, by a known spin coating technique, or any other appropriate coating method. The top-coat composition can be applied over any photoresist imaging layer to form an overlying layer by such coating methods. The thickness of a top-coat or an imaging layer formed using appropriate compositions that are embodiments of the present invention is generally in the range of from about 10 nanometers (nm) to about 300 nm. In some embodiments, it can be from about 20 nm to about 200 nm and in other embodiments from about 30 nm to 160 nm. It should be noted that other thicknesses of both top-coat and imaging layers, greater or less than any of the ranges provided above can also be found useful and thus are within the scope and spirit of the present invention.

Typically, once formed, the top-coat layer exhibits one or more of the following desirable properties: 1) rapid dissolution in an aqueous base developer (for example, 0.26 N tetramethylammonium hydroxide (TMAH)); 2) high transparency at the wavelength used for imagewise exposure, for example, 193 nm and/or 3) an appropriate refractive index, for example, a refractive index of about 1.5 at 193 nm. The first property is desirable so that the topcoat layer is readily integrated into a typical patterning process flow. The second property is desirable so that the top-coat layer does not interfere with the lithographic performance of the imaging layer. The third property can be desirable where, if required, the top-coat layer can act as an anti-reflective layer when water is used as the immersion layer.

Where an imaging layer is formed from a composition embodiment of the present invention, such a layer typically exhibits the following properties: a) limited dissolution of non-exposed regions of the layer in an aqueous base developer (for example, 0.26 N tetramethyl-ammonium hydroxide (TMAH)) at a rate slower than that of a top-coat layer if such is employed; 2) little or no interaction with the solvent used in forming the top-coat composition if such a composition is employer to form an overlying top-coat layer; 3) high sensitivity to the wavelength used for imagewise exposure; 3) the ability to resolve a feature having a dimension of about 65 nm or less with little or no line-edge roughness; and 4) excellent resistance to subsequent processing such as reactive ion etch process.

The following examples include detailed descriptions of polymerizations, and the monomers used therein. Such descriptions may be used to prepare the polymers employed in the embodiments of the present invention. While these examples and the materials described therein fall within the scope and spirit of embodiments of the present invention they are presented for illustrative purposes only, and are not intended as a restriction on such scope and spirit. Other examples presented herein relate to characteristics of the polymers and polymeric compositions that are embodiments of the present invention. Such characteristics are of interest for enabling polymer design embodiments of the present invention as well as for demonstrating that such polymer and polymer compositions of the present invention are useful for immersion lithography processes as described herein.

As used in the polymerization examples and throughout the specification, ratios of monomer to catalyst and cocatalyst are molar ratios. Further, in the examples the terms "sparging" or "sparged" are used repeatedly, such terms will be understood to refer to the passing of nitrogen gas through a liquid to remove dissolved oxygen. Still further, a number of acronyms or abbreviations are used in the examples. To aid in the understanding of these examples, the following listing of such acronyms or abbreviations with their full meaning is provided below:

| | |
|---|---|
| Acid NB: | Bicyclo[2.2.1]hept-5-ene-2-carboxylic acid |
| THF: | Tetrahydrofuran |
| MeOH: | Methanol |
| PGMEA: | Propyleneglycol methylether acetate |
| $M_w$: | Weight average molecular weight |
| $M_n$: | Number average molecular weight |
| PDI: | Polydispersity (PDI = $M_w/M_n$) |
| $^1$H-NMR: | Proton nuclear magnetic resonance spectroscopy |
| $^{19}$F NMR: | Fluorine nuclear magnetic resonance spectroscopy |
| $^{13}$C NMR: | Carbon nuclear magnetic resonance spectroscopy |
| Pd 1206: | (Acetonitrile)bis(triisopropylphosphine)palladium(acetate) tetrakis(pentafluorophenyl)borate |
| Pd 1394: | (Acetonitrile)bis(t-butyldicyclohexylphosphine)palladium (acetate)tetrakis(perfluorophenyl)borate. |
| LiFABA: | lithium tetrakis(pentafluorophenyl)borate diethyl etherate |
| DANFABA: | N-dimethylanilinium tetrakis-(pentafluorophenyl)borate |

Additionally, the following monomer and monomer precursor structures, shown in Structural Groups AA, BB and CC with appropriate acronyms or abbreviations, are provided to further aid in the understanding of the examples. Further it should be noted that of the structures shown in Group BB, the monomer labeled PPVENB was obtained from DuPont FluoroIntermediates of Wilmington, Del. and the monomers labeled C10FAcNB, C8AcNB, CSGAcNB, C9BrAcNB, C10BrAcNB and FHCNB were obtained from Exfluor Research Corporation of Round Rock, Tex.

Structural Group AA

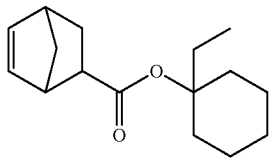

ECHNB

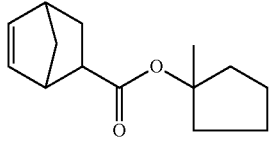

MCPNB

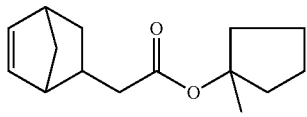

NBCH₂MCP

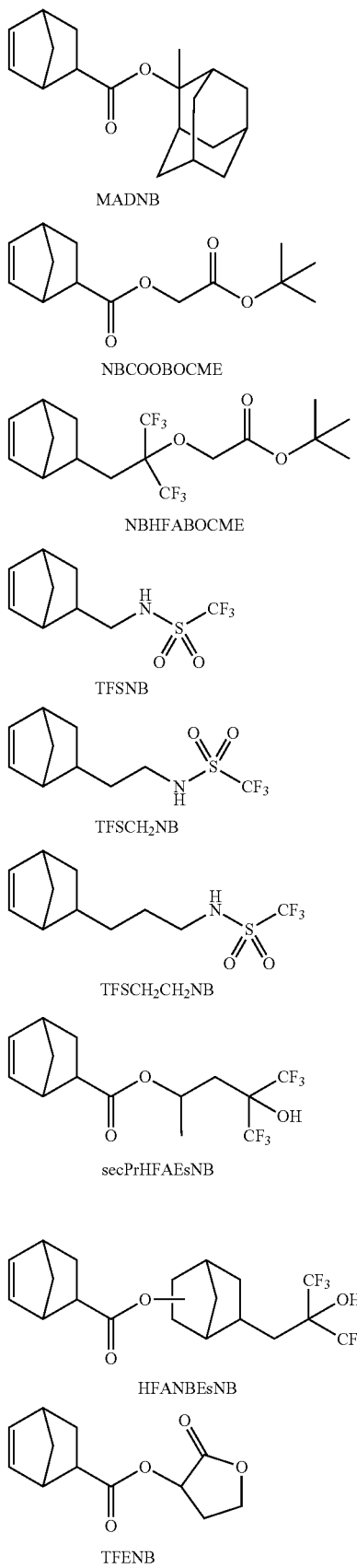

Structural Group BB
Structural Group CC
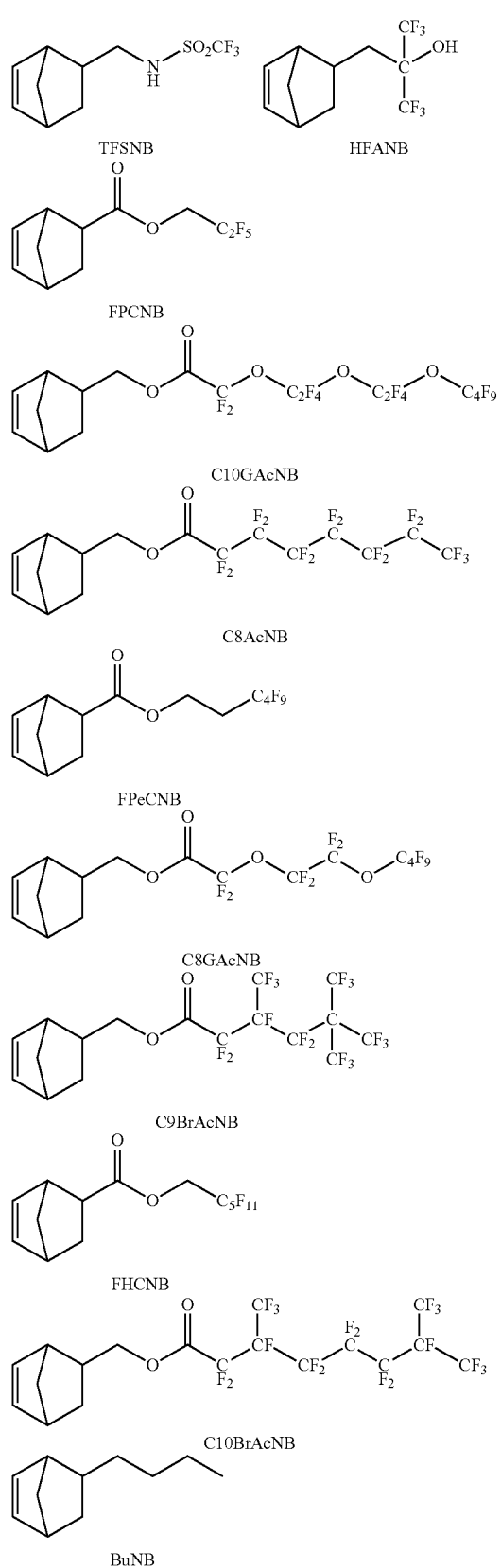

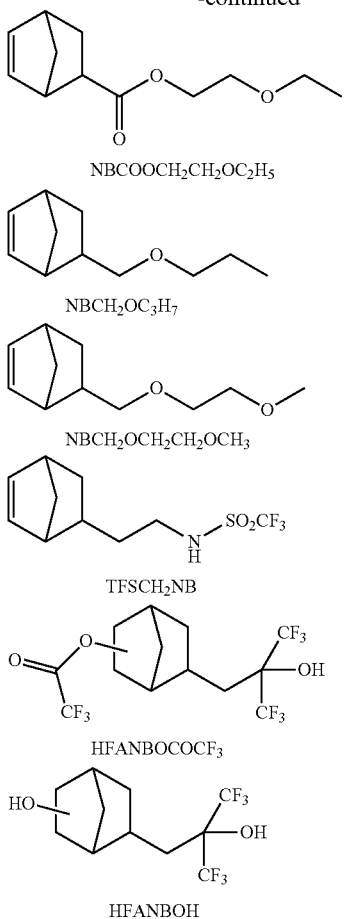

Measurements of CA, SA and dissolution rate were made by one of two sets of procedures. For each of the measurements in each set, a film of interest is cast on a substrate and the measurements reported are of that film. Where applicable, examples P4-P29, measurement set 1 was employed and for other examples measurement set 2 was used.

Measurement Set 1: (a) contact angle: 3 µL drops of pure water were placed at three different locations on the wafer and contact angle of the droplet at each location was determined using a commercial contact angle goniometer (Ramé-Hart model #100-00). The value reported is the mean of the three measurements; (b) sliding angle: a 50 µL was dispensed onto a coated substrate positioned in a proprietary instrument which can increase an incline angle of the substrate from a horizontal position (incline angle=0). The incline angle at which the drop began to slide was taken at the sliding angle. The value reported is an average of two measurements; (c) dissolution rate: the film of interest was cast from a 20% solution of the polymer of interest dissolved in isobutanol. The casting process is adjusted to get a cast film of about 300 nm±75 nm. Initial film thickness and the Cauchy parameters A and B were determined by ellipsometry. Samples were then immersed in 0.26 N tetramethyl ammonium hydroxide (TMAH) for three seconds, withdrawn, rinsed with de-ionized water and dried using a stream of dry nitrogen. After drying, film thickness was remeasured and dissolution rate reported as the change in thickness divided by the time of immersion. Where the substrate was completely cleared of film at the remeasure, a dissolution rate of >100 nm/sec was reported.

Measurement Set 2: (a) contact angle: the film was cast to have a thickness of about 140 nm. In an environment at a temperature of about 25° C. and a relative humidity of 50%, 2 µl of pure water was dropped onto the film, using "Drop Master 700" (by Kyowa Interface Science Co., Ltd.); (b) sliding angle measurements. The rolling-down angle or sliding angle was determined as follows: The protective film-forming material was applied onto a silicon wafer to form thereon a protective film having a thickness of 140 nm. In an environment at room temperature of 25° C. and at a humidity of 50%, 50 µl of pure water was dropped onto the substrate at an inclination speed of 1°/sec, using "Drop Master 700" (by Kyowa Interface Science Co., Ltd.); (c) The dissolution rate (solubility) in developer was determined as follows: The protective film-forming material was applied onto a silicon wafer to form thereon a protective film having a thickness of 350 nm. Using "RDA-800" (by Litho Tech Japan Co., Ltd.), the substrate was kept in contact with an aqueous 2.38 wt % TMAH solution (23.5° C.) for 120 seconds. Waterproofness was determined as follows: The protective film-forming material was applied onto a silicon wafer to form thereon a protective film having a thickness of 140 nm. Using "D-SPINS" (by Dainippon Screen MFG Co., Ltd.), the substrate was kept in contact with pure water (23.5° C.) for 120 seconds.

Optical Density (OD) measurements. Samples were prepared by spin coating a 1-inch quartz wafer with an approximately 15 wt % solution of the desired polymer, typically in propylene glycol methylether acetate (PGMEA). After the samples were baked for 60 sec at 130° C. on a hotplate and allowed to cool, the optical absorbance of each was measured at 193 nm using a Cary 400 Scan UV-Vis spectrophotometer. A blank quartz wafer was used in the reference beam. To determine each samples film thickness, a portion of the film was removed from the quartz wafer and the thickness measured using a Tencor profilometer. Optical density was calculated as absorbance/thickness (in microns). It should be noted that all OD measurements provided values sufficiently low to allow for exposure of an underlying photoresist layer without noticeable image degradation.

MONOMER SYNTHESIS EXAMPLES

Example MS1 secPrHFAEsNB

Dicyclopentadiene (60 g, 0.45 mol) was charged to a 200 mL round bottomed flask equipped with a short-path distillation head. The flask was heated to collect the cyclopentadiene distillation fraction at 30-32° C. In a separate 500 mL, 3-neck round bottomed flask maintained in a nitrogen atmosphere, acrylic acid 4,4,4-trifluoro-3-hydroxy-1-methyl-3-trifluoromethyl-1-butyl ester (50 g, 0.18 mol) and toluene (125 mL) charged. Separately, cyclopentadiene obtained from the distillation (22-23 mL, 0.28 mol) was added by syringe through a rubber septum. After this addition, the flask and its contents was heated to about 35° C. and maintained at that temperature until gas chromatographic (GC) analysis of the reaction mixture indicated a complete conversion of the starting materials, about 19 hours. The product in toluene was concentrated using a rotary evaporator and distilled under reduced pressure using a short-path distillation head to obtain the secPrHFAEsNB monomer product at between about 65-70° C./170 mmHg. The yield of 99% pure monomer, determined by GC was about 95%. The structure was confirmed using $^1$H-NMR analysis.

Example MS2 TFSCH$_2$NB

Norbornene ethylamine (NBCH$_2$CH$_2$NH$_2$) was obtained by first reacting 5-norbornene-2-carboxaldehyde (NBC(O)

H) with nitromethane in the presence of sodium hydroxide in methanol followed by selective reduction of the nitroethyl pendent group with lithium aluminum hydride. This synthesis had being reported by Kas'yan et al, in *Russ. J. Org. Chem.* 2002, 38(1), 29-35. Norbornene ethylamine was reacted with trifluoromethane sulfonic anhydride in the presence of triethylamine to form the target monomer, TFSCH$_2$NB.

Examples MS3 NBXOCH$_3$ and MS4 NBCH$_2$OC$_3$H$_7$

A 60% dispersion of sodium hydride in the quantity shown in Table A was mixed with anhydrous THF (150 mL) and cooled in an ice bath. X as shown in Table A, was added slowly (30 minutes) to the stirred suspension under a nitrogen atmosphere.

TABLE A

|  | MS3 | MS4 |
| --- | --- | --- |
| sodium hydride | 8.8 g, 0.220 mol | 13.2 g, 0.330 mol |
| X | NBXOH | NBCH$_2$OH |
|  | 30.0 g, 0.197 mol | 30.0 g, 0.242 mol |
|  |  | (in 25 mL THF) |
| Y | 2 | 1 |
| Z | methyl iodide | 1-bromopropane |
|  | 70.0 g, 0.493 mol | 59.0 g, 0.479 mol |
| heating time (hours) | 1 | 20 |
| Solvent | Chloroform | Hexanes |
|  | 150 mL | 200 g |
| water | 100 g | 200 g |
| 10% sulfuric acid | 2 × 100 g | 2 × 100 g |
| Water | 3 × 100 g | 2 × 200 g |
| Yield | 85% | 63% |

The mixture was refluxed at 60-65 C for Y hour(s), Z was added and the heating continued for the number of hours shown in Table A. The reaction mixture was filtered. The solvent shown in Table A was added to the filtrate and washed with water, 10% sulfuric acid and water again as shown in Table A. The organic layer dried over anhydrous magnesium sulfate and concentrated. The reduced pressure distillation of the crude product yielded the % of the target compound shown in Table A.

Example MS5 NBHFAEsNB

Trifluoroacetic acid (117 g, 1.02 mol) was added to a solution of HFANB (140 g, 0.511 mol) in toluene (240 mL). The mixture was then stirred for 20 hours under nitrogen atmosphere at room temperature, after which it was diluted with excess toluene and the toluene solution washed with water (250 mL) and a brine solution (300 mL). The organic phase was dried with anhydrous magnesium sulfate, filtered and concentrated. Crude product was purified by reduced pressure distillation to obtain 175 g of the intermediate HFANBOCOCF$_3$.

The HFANBOCOCF$_3$ (175 g, 0.450 mol), obtained above, was mixed with water (750 mL), methanol (300 mL) and sodium hydroxide (30 g, 0.75 mol) and then stirred at room temperature for 1.5 hours. Hydrochloric acid solution (10%) was added to bring the pH of the solution to from 1 to 2 and a split into two layers was observed. A first organic layer (lower layer) was removed and the upper aqueous layer washed with toluene (2×300 mL) and the toluene layers obtained combined with the first organic layer and these combined layers were then washed with water (300 mL) and 10% sodium chloride (300 mL), separated and dried over anhydrous magnesium sulfate. The toluene was removed to obtain 140 g of crude HFANBOH.

The HFANBOH (50 g, 0.17 mol), obtained from above, was dissolved in 300 mL anhydrous THF and cooled in an ice bath. n-Butyllithium (160 mL of 2.5M solution in hexane, 0.4 mol) was added through a rubber septum using a syringe under nitrogen atmosphere. The temperature of the solution was allowed to come to room temperature while stirring for 5 hours. The solution was then cooled to 0-5° C., with stirring, and acrylyl chloride (18.1 g, 0.2 mol) dissolved in 50 mL anhydrous THF was added while stirring was continued. After the addition of the acrylyl chloride completed, the solution was allowed to come to the room temperature and the stirring continued overnight. Next, the reaction mixture was acidified to pH about 4 using 5% hydrochloric acid solution. Two layers formed and the organic layer separated, concentrated using a rotary evaporator and then dissolved in diethyl ether (300 mL). The ether solution was washed with water (2×200 mL) and brine solution (2×200 mL), the dried over anhydrous magnesium sulfate and concentrated. The product (HFANBOCOCHCH$_2$) was purified by distillation under reduced pressure.

HFANBOCOCHCH$_2$ (28.0 g, 0.081 mol), obtained from above, was dissolved in 100 g toluene. Cyclopentadiene (16.0 g, 0.24 mol) was added to the solution and stirred under nitrogen atmosphere at room temperature for 16 hours. Toluene was removed rotary evaporation at 50-60° C. and the crude product was heated to 40-60° C. under vacuum for 1.5-2 hours. The final product, NBHFAEsNB, was purified by column chromatography using silica gel.

The following two examples are in whole or in part, prospective examples directed to monomer synthesis. That is to say, that while some or all of the specific procedures provided below was not yet performed, the inventors believe that the well known chemical process(es) suggested will provide the results indicated.

PROSPECTIVE MONOMER SYNTHESIS EXAMPLE

Example MS1p TFSnPrNB

NBCH$_2$CH$_2$CH$_2$Br is obtained by a Diels-Alder reaction and is converted to NBCH$_2$CH$_2$CH$_2$CN using a known chemical reaction. The nitrile obtained is then chemically reduced with lithium aluminum hydride to form the amide and then treated with trifluoromethane sulfonic anhydride to provide the target compound.

Example MS2p TFSsecPrNB

Portions of this synthesis were modified from the original literature report: Kas'yan, et al. in Russian Journal of Organic Chemistry 2002, 38(1), 29-35. Sodium hydroxide (29.5 g, 0.738 mol) was dissolved in deionized water (75 g) and cooled in an ice bath. Norbornene carboxaldehyde (50.0 g, 0.410 mol), nitroethane (32.3 g, 0.431 mol) and methanol (300 mL) placed in a 1 L 3-neck round bottomed flask and cooled in an ice water/salt bath to about −5 C to −10° C.). The cold sodium hydroxide solution was added to this flask drop wise while keeping the temperature below −5° C. The solution was brought to room temperature in 2 hours and the stirring continued for 15 hours at room temperature. The white solid mass formed was partially dissolved in cold water (500 mL). This suspension was added to 20% hydrochloric acid solution (600 mL) and extracted with methylene chloride (2×300 mL). The methylene chloride extract was washed with brine solution (2×250 mL), dried over anhydrous magnesium sulfate, filtered and concentrated. The reduced pressure distillation of the crude product yielded the target compound (NBCH=C(CH$_3$)NO$_2$) in 47% yield.

It is believed that the nitro compound (NBCH=C(CH$_3$)NO$_2$) will be selectively reduced by lithium aluminum hydride to form the corresponding amine, NBCH$_2$CH(CH$_3$)NH$_2$. Further, it is believed that this amine will be further derivatized to the sulfonamide product (TFSsecPrNB) by reaction with trifluoromethane sulfonic chloride or trifluoromethane sulfonic anhydride in the presence of a triethylamine base.

Examples P1; P2 and P3

Polymers of TFSNB and HFANB, FPCNB or C8AcNB

The variables for these examples are shown in Table B. To a glass reactor equipped with stirring, TFSNB toluene; ethyl acetate; and one of HFANB, FPCNB, or C8AcNB; were added. The mixture was sparged and placed in the dry box where solid DANFABA and triethylsilane were added. The reactor was taken out of the dry box and sparged glacial acetic acid, was added. The mixture was then heated to 100° C. after which Pd-1206 in ethyl acetate was added. The mixture was maintained at 100° C. with stirring for the length of time indicated and then allowed to cool to room temperature. The amount of total solids indicated that essentially 100% conversion of monomers had occurred. Each reaction mixture was purified to remove residual monomer and catalyst. The analytical data obtained is shown in the table below.

TABLE B

|  | P1 | P2 | P3 |
|---|---|---|---|
| TFSNB | 365.8 g | 388.1 g | 356.2 g |
|  | 1.435 mol | 1.520 mol | 1.397 mol |
| HFANB, FPCNB, or C8AcNB | 98.6 g | 102.7 g | 128.7 g |
|  | 0.360 mol | 0.3801 mol | 0.248 mol |
| toluene | 507.4 g | 533.6 g | 529.6 g |
| ethyl acetate | 116 g | 65.7 g | 79 g |
| DANFABA | 2.16 g | 4.57 g | 3.96 g |
|  | $2.70 \times 10^{-3}$ mol | $5.70 \times 10^{-3}$ mol | $4.95 \times 10^{-3}$ mol |
| triethylsilane | 14.6 g | 15.5 g | 13.4 g |
|  | 0.126 mol | 0.133 mol | 0.116 mol |
| glacial acetic acid | 2.16 g | 2.28 g | 1.98 g |
|  | 0.0360 mol | 0.038 mol | 0.0330 mol |
| Pd-1206 | 1.09 g | 2.29 g | 1.99 g |
|  | $9.04 \times 10^{-4}$ mol | $1.90 \times 10^{-3}$ mol | $1.65 \times 10^{-3}$ mol |
| ethyl acetate | 53.2 g | 112.3 g | 97.5 |
| hours | 17 | 16 | 18 |
| $M_w$ | 4990 | 5100 | 5020 |
| $M_n$ | 3360 | 3700 | 3440 |
| PDI | 1.49 | 1.38 | 1.46 |
| Molar Ratio | 81:19 | 81:19 | 90:10 |
| CA | 71° | 79° | 93° |
| SA | 19° | 19° | 18° |
| RA | 61° | 69° | 74° |
| Dissolution Rate | 2200 nm/sec | 900 nm/sec | 600 nm/sec |
| OD | 0.10 μ$^{-1}$ | 0.11 μ$^{-1}$ | 0.16 μ$^{-1}$ |

Examples P4 and P5

Homopolymers of secPrHFAEsNB and TFSCH$_2$NB

The variables for these examples P4 and P5 are shown in Table C. In example P4, secPrHFAEsNB monomer and anhydrous toluene (30 mL) were mixed in a 100 mL crimp-cap vial, nitrogen purged for 10 minutes and sealed. The vial was moved to a dry box, unsealed and Pd-1394, LiFABA and triethyl silane were added and the vial resealed. Glacial acetic acid was then added by syringe. The reaction mixture was heated for about 23 hours at 90° C. in an oil bath to obtain a clear yellow liquid. After purification to remove residual monomer and catalyst, the reaction mixture was precipitated using hexanes and dried under vacuum at 90° C.

In example P5, TFSCH$_2$NB, toluene, and ethyl acetate were added to a glass reactor equipped with stirring. The mixture was sparged and then placed into a dry box and solid DANFABA, Pd-1206 and triethylsilane added. The reactor was taken out of the dry box and sparged glacial acetic acid added. The mixture was heated to 100° C. for 17.5 hours then allowed to cool to room temperature, after which it was purified to remove residual monomer and catalyst. The analytical data obtained is shown in the table below.

TABLE C

|  | P4 | P5 |
|---|---|---|
| secPrHFAEsNB or TFSCH$_2$NB | 17.3 g | 53.8 g |
|  | 0.05 mol | 0.200 mol |
| toluene | 30 mL | 60.0 g |
| ethyl acetate | — | 20.0 g |
| DANFABA or LiFABA | 0.131 g | 0.160 g |
|  | $1.50 \times 10^{-4}$ mol | $2.0 \times 10^{-4}$ mol |
| Pd-1394 or Pd-1206 | 0.070 g | 0.080 g |
|  | $5.0 \times 10^{-5}$ mol | $6.6 \times 10^{-5}$ mol |
| triethylsilane | 0.291 g | 1.74 g |
|  | $2.51 \times 10^{-3}$ mol | 0.0150 mol |
| glacial acetic acid | 0.06 g | 0.24 g |
|  | $1.0 \times 10^{-3}$ mol | $4.0 \times 10^{-3}$ mol |
| yield | 11 g (64%) | — |
| $M_w$ | 6870 | 6560 |

TABLE C-continued

|  | P4 | P5 |
|---|---|---|
| $M_n$ | 4630 | 4000 |
| PDI | 1.48 | 1.64 |
| CA | 90° | 79° |
| SA | 26° | 22° |
| OD | — | 0.03 μ$^{-1}$ |

Examples P6; P7 and P8

Polymers of TFSNB and HFANB (6&7) or BuNB

The variables for examples P6, P7, and P8 are shown in Table D. For P6 and P7, TFSNB, HFANB, toluene, and ethyl acetate were added to a glass reactor with stirring and sparged and moved to the dry box. For example P8 TFSNB, HFANB, toluene and ethyl acetate were added in the dry box. Solid DANFABA, Pd-1206 and triethylsilane were added to the reactor and the reactor sealed and removed from the dry box. Sparged glacial acetic acid was added to the reaction mixture, after which it was to 100° C., with stirring, for the length of time shown in Table D. The reaction mixture was allowed to cool to room temperature. Total solids determination of the reaction mixture indicated that essentially 100% conversion of monomer had occurred. The reaction mixture was purified to remove residual monomer and catalyst. For P8, purification included precipitation of the polymer from hexane, which was collected by filtration and dried under vacuum at 90° C. The analytical data obtained is shown in the table.

TABLE D

|  | P6 | P7 | P8 |
| --- | --- | --- | --- |
| TFSNB | 34.5 g | 28.6 g | 9.19 g |
|  | 0.135 mol | 0.112 mol | 0.0360 mol |
| HFANB or BuNB | 4.11 g | 7.67 g | 0.59 g |
|  | 0.015 mol | 0.0280 mol | $4.0 \times 10^{-3}$ mol |
| triethylsilane | 1.221 g | 1.14 g | 0.35 g |
|  | 0.0105 mol | $9.83 \times 10^{-3}$ mol | $3.0 \times 10^{-3}$ mol |
| toluene | 45 g | 45 g | 10 g |
| ethyl acetate | 15 g | 15 g | 3.4 g |
| DANFABA | 0.180 g | 0.168 g | 0.048 g |
|  | $2.25 \times 10^{-4}$ mol | $2.10 \times 10^{-4}$ mol | $6.0 \times 10^{-5}$ mol |
| Pd-1206 | 0.090 g | 0.084 g | 0.024 g |
|  | $7.5 \times 10^{-5}$ mol | $7.0 \times 10^{-5}$ mol | $2.0 \times 10^{-5}$ mol |
| glacial acetic acid | 0.180 g | 0.168 g | 0.048 g |
|  | $3.0 \times 10^{-3}$ mol | $2.80 \times 10^{-3}$ mol | $8.0 \times 10^{-4}$ mol |
| hours | 16.5 | 16.5 | 20 |
| $M_w$ | 5000 | 5350 | 3810 |
| $M_n$ | 3580 | 3740 | 2440 |
| PDI | 1.40 | 1.43 | 1.56 |
| Molar Ratio | 90:10 | 81:19 | — |
| CA | 78° | 77° | 78° |
| SA | 23° | 23° | 26° |
| OD | 0.06 $\mu^{-1}$ | 0.06 $\mu^{-1}$ | — |

Examples P9; P10 and P11

Polymers of TFSNB and BuNB, C8AcNB and secPrHFAEsNB

The variables for examples P9, P10, and P11 are shown in Table E. For P10 and P11, TFSNB, toluene, ethyl acetate and one of C8AcNB or secPrHFAEsNB were added to a glass reactor with stirring and the mixture sparged, after which the reactor was placed in a dry box. For P9, the reactor was placed in a dry box before TFSNB, BuNB, toluene and ethyl acetate were added. In the dry box; triethylsilane; Pd-1206; and DANFABA were added with stirring, the reactor capped and brought out the dry box. Sparged glacial acetic acid was added and the mixture heated to 100° C. for the length of time indicated in the table then allowed to cool to room temperature. The reaction mixture was added into hexane to cause precipitation and the polymer was collected dried under vacuum at 90° C. The analytical data obtained is shown in the table.

TABLE E

|  | P9 | P10 | P11 |
| --- | --- | --- | --- |
| TFSNB | 8.17 g | 147.5 g | 20.7 g |
|  | 0.032 mol | 0.578 mol | 0.0812 mol |
| BuNB, C8AcNB, or secPrHFAEsNB | 1.19 g | 53 g | 18.7 g |
|  | $7.93 \times 10^{-3}$ mol | 0.102 mol | 0.0540 mol |
| Triethylsilane | 0.35 g | 5.54 g | 1.14 g |
|  | $3.0 \times 10^{-3}$ mol | 0.0476 mol | $9.74 \times 10^{-3}$ mol |

TABLE E-continued

|  | P9 | P10 | P11 |
| --- | --- | --- | --- |
| Toluene | 10 g | 225 g | 45 g |
| ethyl acetate | 3.4 g | 75 g | 15.0 g |
| DANFABA | 0.048 g | 0.817 g | 0.325 g |
|  | $6.0 \times 10^{-5}$ mol | $1.02 \times 10^{-3}$ mol | $4.05 \times 10^{-4}$ mol |
| Pd-1206 | 0.024 g | 0.410 g | 0.163 g |
|  | $2.0 \times 10^{-5}$ mol | $3.4 \times 10^{-4}$ mol | $1.35 \times 10^{-4}$ mol |
| glacial acetic acid | 0.048 g | 0.817 g | 0.162 g |
|  | $8.0 \times 10^{-4}$ mol | 0.0136 mol | $2.7 \times 10^{-3}$ mol |
| Hours | 20 | 18 | 18 |
| $M_w$ | 4410 | 6975 | 5350 |
| $M_n$ | 2600 | 4450 | 4100 |
| PDI | 1.70 | 1.57 | 1.31 |
| Molar Ratio | — | 92:8 | 57:43 |
| CA | 81° | 89° | 82° |
| SA | 20° | 28° | 23° |
| OD | — | 0.10 $\mu^{-1}$ | 0.10 $\mu^{-1}$ |

Examples P12; P13 and P14

Polymers of TFSNB and secPrHFAEsNB, C9BrAcNB or C10BrAcNB

The variables for examples P12, P13, and P14 are shown in Table F. For P13 and P14, a glass reactor equipped with stirring was placed in a dry box and TFSNB, toluene, ethyl acetate and one of C9BrAcNB or C10BrAcNB were added. For P12, TFSNB, secPrHFAEsNB, toluene and ethyl acetate were added to a glass reactor, the mixture sparged, and then placed in a dry box. For each of P12, P13 and P14, DANFABA, Pd-1206 and triethylsilane were added to the reactor, the reactor sealed and removed from the dry box. Sparged glacial acetic acid was then added and the mixture heated to 100° C., with stirring, for the length of time shown in the table after which it was allowed to cool to room temperature. The reaction mixture was purified to remove residual monomer and catalyst. For P13 the reaction mixture was added to heptane and in P14 to hexane, the resulting precipitate collected and dried. The analytical data obtained is shown in the table.

TABLE F

|  | P12 | P13 | P14 |
| --- | --- | --- | --- |
| TFSNB | 28.6 g | 51.1 g | 45.0 g |
|  | 0.112 mol | 0.200 mol | 0.176 mol |
| secPrHFAEsNB, C9BrAcNB or C10BrAcNB | 9.69 g | 28.5 g | 27.3 g |
|  | 0.0280 mol | 0.0500 mol | 0.0440 mol |
| triethylsilane | 1.188 g | 2.04 g | 1.93 g |
|  | 0.0102 mol | 0.0175 mol | 0.0166 mol |
| Toluene | 45 g | 89.5 g | 80 g |
| ethyl acetate | 15 g | 29.8 g | 27 g |
| DANFABA | 0.337 g | 0.601 g | 0.529 g |
|  | $4.20 \times 10^{-4}$ mol | $7.50 \times 10^{-4}$ mol | $6.61 \times 10^{-4}$ mol |
| Pd-1206 | 0.169 g | 0.302 g | 0.265 g |
|  | $1.40 \times 10^{-4}$ mol | $2.50 \times 10^{-4}$ mol | $2.20 \times 10^{-4}$ mol |
| glacial acetic acid | 0.168 g | 0.30 g | 0.26 g |
|  | $2.80 \times 10^{-3}$ mol | $5.0 \times 10^{-3}$ mol | $4.4 \times 10^{-3}$ mol |
| Hours | 15 | 20 | 22 |
| Yield | — | 37 g 47% | 36.4 g 50% |
| $M_w$ | 5100 | 5060 | 5110 |
| $M_n$ | 3650 | 3660 | 3760 |
| PDI | 1.39 | 1.38 | 1.36 |
| Molar Ratio | 79:21 | 79:21 | 87:13 |
| CA | 82° | 89° | 89° |
| SA | 26° | 22° | 25° |
| OD | 0.09 $\mu^{-1}$ | 0.17 $\mu^{-1}$ | 0.13 $\mu^{-1}$ |

Examples P15; P16 and P17

Polymers of TFSNB and C8GAcNB, C10GAcNB or iBornylEsNB

The variables for examples P15, P16, and P17 are shown in Table G. In the dry box; TFSNB; triethylsilane; toluene; ethyl acetate; Pd-1206; DANFABA and one of C8GAcNB, C10GAcNB, or iBornylEsNB were added to a glass reactor equipped with stirring. The reactor was capped and brought out the dry box. Glacial acetic acid, sparged with nitrogen, was added and the mixture heated to 100° C. for the length of time shown in table, after which it was allowed to cool to room temperature. After purification to remove residual monomer and catalyst, the reaction mixture was added into heptane to cause precipitation, the precipitate collected and dried under vacuum at 90° C. The analytical data obtained is shown in the table. It should be noted that during the purification and isolation of the P15 and P16 polymers some amount of 5-norbornene-2-methanol is formed from the corresponding norbornene acetate, and that for the P17 polymer, similarly, some amount of norbornene carboxylic acid is formed from the norbornene ester. These amounts are presented as the last number in the molar ratios shown in the table below.

TABLE G

|  | P15 | P16 | P17 |
|---|---|---|---|
| TFSNB | 81.7 g | 47.0 g | 51.1 g |
|  | 0.320 mol | 0.184 mol | 0.200 mol |
| C8AcNB, C10BrAcNB or iBornylEsNB | 44.2 g | 30.7 g | 13.7 g |
|  | 0.0800 mol | 0.0460 mol | 0.0500 mol |
| triethylsilane | 3.26 g | 1.87 g | 2.04 g |
|  | 0.0280 mol | 0.0161 mol | 0.0175 mol |
| Toluene | 142 g | 87.4 g | 72.8 g |
| ethyl acetate | 47.2 g | 29.1 g | 24.3 g |
| DANFABA | 0.481 g | 0.553 g | 0.601 g |
|  | $6.01 \times 10^{-4}$ mol | $6.90 \times 10^{-4}$ mol | $7.51 \times 10^{-4}$ mol |
| Pd-1206 | 0.241 g | 0.277 g | 0.302 g |
|  | $2.00 \times 10^{-4}$ mol | $2.30 \times 10^{-4}$ mol | $2.50 \times 10^{-4}$ mol |
| glacial acetic acid | 0.48 g | 0.276 g | 0.300 g |
|  | $8.0 \times 10^{-3}$ mol | $4.6 \times 10^{-3}$ mol | $5.0 \times 10^{-3}$ mol |
| Hours | 19 | 20 | 20 |
| Yield | 50 g 40% | 27 g 35% | 37 g 57% |
| $M_w$ | 5150 | 5180 | 4870 |
| $M_n$ | 3740 | 3860 | 3540 |
| PDI | 1.38 | 1.34 | 1.38 |
| Molar Ratio | 84:4:12 | 87:3:10 | 82:14:4 |
| CA | 90° | 85° | 76° |
| SA | 24° | 26° | 26° |
| OD | 0.08 $\mu^{-1}$ | 0.10 $\mu^{-1}$ | 0.19 $\mu^{-1}$ |

Examples P18; P19 and P20

Polymers of TFSNB and NBXOCH$_3$, NBCH$_2$OCH$_2$CH$_2$OCH$_3$, or NBC(O)OCH$_2$CH$_2$OH The variables for examples P18, P19, and P20 are shown in Table H below. To a glass reactor equipped with stirring; TFSNB, toluene, ethyl acetate and one of NBXOCH$_3$, NBCH$_2$OCH$_2$CH$_2$OCH$_3$, or NBCOOCH$_2$CH$_2$OH were added. The mixture was sparged with nitrogen for 10 min and moved to a dry box in which solid DANFABA, Pd-1206 and triethylsilane were added to the reactor, the reactor sealed and removed from the dry box. Glacial acetic acid, sparged with nitrogen, was then added and the mixture heated to 100° C. for the length of time shown in the table, after which it was allowed to cool to room temperature. For P18, THF (2 g) and toluene (4.5 g) were added to the reaction mixture, and then this was poured into hexanes (200 g) to cause precipitation. The precipitate was collected and then dried in a vacuum oven at 90° C. The analytical data obtained is shown in the table.

TABLE H

|  | P18 | P19 | P20 |
|---|---|---|---|
| TFSNB | 7.65 g | 7.14 g | 7.14 g |
|  | 0.0300 mol | 0.0280 mol | 0.0280 mol |
| NBXOCH$_3$, NBCH$_2$OCH$_2$CH$_2$OCH$_3$, or NBCOOCH$_2$CH$_2$OH | 1.66 g | 2.18 g | 2.18 g |
|  | 0.01 mol | 0.0120 mol | 0.0130 mol |

TABLE H-continued

|  | P18 | P19 | P20 |
|---|---|---|---|
| triethylsilane | 0.326 g<br>$2.8 \times 10^{-3}$ mol | 0.326 g<br>$2.8 \times 10^{-3}$ mol | 0.326 g<br>$2.8 \times 10^{-3}$ mol |
| Toluene | 12.0 g | 12.0 g | 12.0 g |
| ethyl acetate | 4.0 g | 4.0 g | 4.0 g |
| DANFABA | 0.048 g<br>$6.0 \times 10^{-5}$ mol | 0.048 g<br>$6.0 \times 10^{-5}$ mol | 0.048 g<br>$6.0 \times 10^{-5}$ mol |
| Pd-1206 | 0.024 g<br>$2.0 \times 10^{-5}$ mol | 0.024 g<br>$2.0 \times 10^{-5}$ mol | 0.024 g<br>$2.0 \times 10^{-5}$ mol |
| glacial acetic acid | 0.048 g<br>$8.0 \times 10^{-4}$ mol | 0.048 g<br>$8.0 \times 10^{-4}$ mol | 0.048 g<br>$8.0 \times 10^{-4}$ mol |
| Hours | 19 | 16 | 16 |
| Yield | 7.5 g — | 8.99 g — | 7.21 g 77% |
| $M_w$ | 3900 | 4017 | 5109 |
| $M_n$ | 2200 | 2496 | 2831 |
| PDI | 1.77 | 1.61 | 1.80 |
| CA | 78° | 74° | 75° |
| SA | 26° | 30° | 29° |

Examples P21, P22 and P23

Polymers of TFSNB and NBCH$_2$OCH$_2$CH$_2$CH$_3$, NBC(O)OCH$_2$CH$_2$OC$_2$H$_5$ or PPVENB The variables for examples P21, P22 and P23 are shown in Table J below. For P21 and P22, TFSNB, the appropriate monomer, toluene, and ethyl acetate were added to a glass reactor equipped with stirring, the mixture was sparged and placed in a dry box. For P22, TFSNB, PPVENB, toluene and ethyl acetate were added to a glass reactor placed in a dry box. To the reactor in the dry box; solid DANFABA, Pd-1206 and triethylsilane were added, the reactor sealed and taken out of the dry box. Sparged glacial acetic acid was added and the mixture heated to 100° C. for the length of time shown in the table. The reaction mixture was then allowed to cool to room temperature. For P21 and P22, THF (2 g) was added to the reaction mixture, and then the reaction mixture was poured into hexanes (200 g) to cause precipitation. For P23, the undiluted reaction mixture was added to hexane to cause precipitation. The TFSNB to PPVENB ratio was found to be 84 to 16 and the OD of the polymer was 0.14μ$^{-1}$. The precipitates or all the reactions were collected and dried in a vacuum oven at 90° C. The analytical data obtained for the polymers is shown in the table below.

Examples P24a-e ECHNB/TFENB/TFSNB

Examples P24a-e disclose the synthesis of ECHNB/TFENB/TFSNB polymers that have different monomer ratios. The results obtained indicate that CA and SA seem to be a function of ECHNB concentration in the polymer In 50 mL crimp-cap vials, 0.050 moles of monomer encompassing different proportions of ECHNB, TFENB, and TFSNB for each vial (the proportions are shown in Table K), were dissolved in toluene (20 g). These solutions were sparged with nitrogen for 10 minutes, sealed and transferred to a dry box.

The vials were unsealed and Pd-1394 (0.070 g, 0.00005 mol), Li FABA (0.131 g, 0.00015 mol) and triethylsilane (0.116 g, 0.001 mol) were added to each. The vials were then re-sealed and removed from the dry box where glacial acetic acid (0.060 g, 0.001 mol), sparged with nitrogen, was added to each solution through the teflon septa and the solutions were heated to 90° C. for 18 hours in an oil bath. The contents of the vials were then allowed to cool to room temperature and 2 g of THF added to each. The polymer solutions were then added to excess n-heptane to cause precipitation. Solid polymer was collected and dried overnight at 90° C. in a vacuum oven. Yield, molecular weights, polydispersity, CA and SA for each polymer is shown in Table K.

TABLE J

|  | P21 | P22 | P23 |
|---|---|---|---|
| TFSCH$_2$NB | 7.14 g<br>0.0280 mol | 7.14 g<br>0.0280 mol | 40.6 g<br>0.160 mol |
| NBCH$_2$OCH$_2$CH$_2$CH or PPVENB | 1.99 g<br>0.0120 mol | 2.52<br>0.0120 mol | 15.6 g<br>0.040 mol |
| toluene | 12.0 g | 12.0 g | 61.3 g |
| ethyl acetate | 4.0 g | 4.0 g | 8.63 g |
| DANFABA | 0.048 g<br>$6.0 \times 10^{-5}$ mol | 0.048 g<br>$6.0 \times 10^{-5}$ mol | 0.48 g<br>$6.0 \times 10^{-4}$ mol |
| Pd-1206 | 0.024 g<br>$2.0 \times 10^{-5}$ mol | 0.024 g<br>$2.0 \times 10^{-5}$ mol | 0.241 g<br>$2.0 \times 10^{-4}$ mol |
| triethylsilane | 0.326 g<br>$2.8 \times 10^{-3}$ mol | 0.326 g<br>$2.8 \times 10^{-3}$ mol | 1.62 g<br>0.0140 mol |
| glacial acetic acid | 0.048 g<br>$8.0 \times 10^{-4}$ mol | 0.048 g<br>$8.0 \times 10^{-4}$ mol | 0.24 g<br>$4.0 \times 10^{-3}$ mol |
| hours | 16 | 17 | 16 |
| yield | 8.30 g 91% | 8.45 g 87% | 37.8 g 67% |
| $M_w$ | 4399 | 129,810 | 4840 |
| $M_n$ | 2721 | 3777 | 3530 |
| PDI | 1.62 | 34.4 | 1.37 |
| CA | 80° | 79° | 86° |
| SA | 26° | 24° | 21° |

TABLE K

Properties of the polymers in Example P24

| | % ECHNB | % TFENB | % TFSNB | yield (%) | Mw | Mn | PDI | Contact angle | Sliding angle |
|---|---|---|---|---|---|---|---|---|---|
| a | 70 | 30 | 0 | 65 | 9158 | 4478 | 2.04 | 81 | 28 |
| b | 60 | 10 | 30 | 72 | 9806 | 5243 | 1.87 | 79 | 23 |
| c | 51 | 33 | 16 | 62 | 9753 | 5170 | 1.88 | 78 | 24 |
| d | 40 | 20 | 40 | 65 | 10648 | 5638 | 1.89 | 77 | 25 |
| e | 30 | 40 | 30 | 58 | 10720 | 5301 | 2.02 | 77 | 25 |

Examples P25, P26 and P27

Polymers of ECHNB/TFENB/TFSCH$_2$NB

The monomers were added to a 50 mL crimp-cap vial, and dissolved in toluene (20 g). The solutions was sparged, sealed and then transferred to a dry box.

To each of the solutions, Pd-1394 (0.070 g, 0.00005 mol), Li FABA (0.131 g, 0.00015 mol), and triethylsilane (0.116 g, 0.001 mol) were added, the vials resealed and taken out of the dry box. Sparged glacial acetic acid (0.060 g, 0.001 mol) was added through a Teflon septa and the solutions were heated to 90° C. for about 18 hours in an oil bath. The contents of each vial was allowed to cool to room temperature and 2 g of THF added. A sample of the contents was removed to determine the molecular weights, then the solutions were added to excess n-heptane to cause precipitation, the solids collected and dried overnight at 90° C. in a vacuum oven and weighed. Yield, molecular weights, polydispersity, CA and SA for each polymer is shown in Table M.

TABLE M

| | P25 | P26 | P27 |
|---|---|---|---|
| TFSCH$_2$NB | 4.04 g | 4.04 g | 1.35 g |
| | 0.015 mol | 0.015 mol | 0.005 mol |
| ECHNB | 4.96 g | 7.45 g | 7.45 g |
| | 0.020 mol | 0.030 mol | 0.030 mol |
| TFENB | 3.33 g | 1.11 | 3.33 g |
| | 0.015 mol | 0.005 mol | 0.015 mol |
| yield | 10.6 g | 9.3 g | 8.8 g |
| M$_w$ | 15,032 | 11,479 | 11,888 |
| M$_n$ | 6746 | 5692 | 5532 |
| PDI | 2.28 | 2.01 | 2.15 |
| CA | 80° | 82° | 80° |
| SA | 22° | 23° | 23° |

Examples P28a-g

Polymers of TFENB with Monomers Indicated in Table N

This example discloses the synthesis of polymers having three monomers in same feed ratios (30% A, 50% B, and 20% TFENB).

In 50 mL crimp-cap vials, 0.015 moles of monomer A, 0.025 moles of monomer B, and 0.010 moles of TFENB were dissolved in toluene (20 g). These solutions were sparged and then sealed and transferred to a dry box.

To each solution, Pd-1394 (0.070 g, 0.00005 mol), Li FABA (0.131 g, 0.00015 mol), and triethylsilane (0.116 g, 0.001 mol) were added, and the vials resealed and taken out of the dry box. Sparged glacial acetic acid (0.060 g, 0.001 mol) was added to each solution through a Teflon septa and the solutions were heated to 90° C. for 18 hours in an oil bath. The contents were allowed to cool to room temperature and 2 g of THF added to each vial. A sample of each vial was removed to determine the molecular weights and polydispersities shown in Table N. After which the solutions were added to excess n-heptane to cause precipitation, the solids collected and dried overnight at 90° C. in a vacuum oven. The CA's and SA's of thin films of each polymer on a bare silicon wafer were measured and the data obtained shown in Table N.

TABLE N

| | Monomer A | Monomer B | Monomer C | yield (%) | Mw | Mn | PDI | CA | SA |
|---|---|---|---|---|---|---|---|---|---|
| a | TFSNB | MADNB | TFENB | 83 | 7227 | 3807 | 1.90 | 79 | 24 |
| b | TFSCH$_2$NB | MADNB | TFENB | 84 | 10869 | 5121 | 2.12 | 80 | 22 |
| c | TFSCH$_2$CH$_2$NB | MADNB | TFENB | 88 | 10685 | 5109 | 2.09 | 84 | 21 |
| d | TFSNB | NBCH$_2$MCP | TFENB | 75 | 7750 | 3805 | 2.04 | 80 | 22 |
| e | secPrHFAEsNB | NBCH$_2$MCP | TFENB | 69 | 8117 | 4281 | 1.90 | 84 | 20 |
| f | TFSNB | HFABOCME | TFENB | 76 | 10892 | 5674 | 1.92 | 86 | 20 |
| g | TFSNB | NBCOOBOCME | TFENB | 81 | 9049 | 4705 | 1.92 | 87 | 24 |

It is believed that the results shown from Examples P28a-g demonstrate that hydrophobicity (as shown by a high CA and a low SA) can be controlled, at least in part, by the changes in the monomer structures employed for the polymerization. Specifically, (1) changing the developer soluble, monomer component from TFSNB to TFSCH$_2$NB and TFSCH$_2$CH$_2$NB increases the hydrophobicity (see, a, b and c); (2) changing the developer soluble monomer component from TFSNB to secPrHFAEsNB increases hydrophobicity (see, d and e); and (3) changing the acid labile monomer component to HFABOCME or NBCOOBOCME increases the hydrophobicity (compare a with f and d with g).

Example P29a-g

Polymers Derived from ECHNB/TFENB/TFSNB Monomers

ECHNB/TFENB/TFSNB monomers were polymerized using the feed ratios shown in Table P. The polymerization method used was analogous to that described in Examples 24, except that the amount of triethylsilane added was varied to provide for polymers of differing molecular weights.

After solid polymer was isolated and dried, each was dissolved in PGMEA and cast onto a bare silicon wafer by a spin coating method. Each wafer was soft baked at 90° C. for 90 seconds, after which the film thicknesses were measured by ellipsometry. Each wafer was then placed on a spin chuck and covered in 2-butanol, after 3 seconds the liquid was removed by spinning. The films were then baked again at 90° C. for 90 seconds and the thickness remeasured. The resistance of the polymer films to 2-butanol were measured by the film thickness change. The data for feed ratio, Mw and change in thickness after the immersion in iso-butanol is shown in Table P.

TABLE P

| Monomer feed (ECHNB/TFENB/TFSNB) | Mw | Thickness change (nm) |
|---|---|---|
| a | 40/30/30 | 7723 | −11 |
| b | 40/40/20 | 6500 | +1 |
| c | 40/50/10 | 7975 | +2 |
| d | 40/30/30 | 12453 | 0 |
| e | 40/40/20 | 15600 | −2 |
| f | 40/50/10 | 11142 | +4 |
| g | 40/40/20 | 25600 | +3 |

It is believed that the results shown from Examples P29a-g demonstrate that film thickness loss (in isobutanol) is controlled in part by both the polymer molecular weight and composition. That is to say that generally, the higher the concentration of TFENB (or the lower the concentration of TFSNB) results in less film thickness loss (compare e and f), as does a higher molecular weight (compare e and g).

Example P30a

TFSNB/TFENB/ECHNB/Acid NB of Polymer

In a 500 mL reaction vessel equipped with a 3-valve stopper and stirring, ECHNB (13.02 g, 0.053 mol), TFENB (12.20 g, 0.055 mol), and TFSNB (19.13 g, 0.075 mol) were dissolved in toluene (77 g). In a 50 mL crimp-cap vial, ECHNB (14.73 g, 0.059 mol) and TFENB (5.56 g, 0.025 mol) were dissolved in toluene (11.1 g). Both solutions were sparged and then sealed.

To the solution in the reaction vessel, Pd-1394 (1.394 g, 0.001 mol), Li FABA (2.613 g, 0.003 mol), and triethylsilane (1.16 g, 0.01 mol) were added, and the solution was mixed. Glacial acetic acid (0.30 g, 0.005 mol) was added to the solution in the reaction vessel and the solution was heated to 90° C. overnight.

During the heating of the reaction vessel, the solution in the crimp-cap vial was transferred to the vessel in accordance with a pre-determined metering protocol (0.065 mL/min for 54 minutes, 0.077 mL/min for 45 min, 0.041 mL/min for 84 min, 0.022 mL/min for 155 minutes, 0.012 mL/min for 286 minutes, 0.007 mL/min for 530 minutes, and 0.004 mL/min for 572 minutes).

After treatment to remove catalyst residue from the polymer, the resulting solution was concentrated using a rotary evaporator and the polymer product was precipitated with an excess of hexane. The colorless solid polymer obtained (26 g) was dried overnight at 90° C. in a vacuum oven, dissolved in 1:1 THF/MeOH mixture (60 mL) and precipitated with an excess of 90:10 MeOH/water. The polymer was dried overnight at 90° C. in a vacuum oven to obtain 23.3 g of the polymer (38% isolated yield).

$^1$H-NMR analysis of the final product did not indicate the presence of residual monomer and the $^{13}$C NMR analysis revealed a composition of approximately 35/31/30/4 of ECHNB/TFENB/TFSNB/Acid NB. $M_w$, $M_n$, and PDI were determined to be 4300, 2600 and 1.66, respectively. A thin film (about 1 micron) of this polymer, spun on silicon wafer from a 20% solution in PGMEA, had a CA of 77°±2°.

Example P30b

TFSNB/TFENB/ECHNB/Acid NB Polymer

This polymerization was done in the same manner as P30a, except that 0.73 g, 0.0063 mol of triethylsilane was added to the solution in the reaction vessel and the solution in the crimp-cap vial was transferred to the reaction vessel under an inert atmosphere in accordance with the following metering protocol: (0.065 mL/min for 54 minutes, 0.077 mL/min for 45 min, 0.041 mL/min for 84 min, 0.022 mL/min for 155 minutes, 0.012 mL/min for 286 minutes, 0.007 mL/min for 530 minutes, and 0.004 mL/min for 978 minutes).

40 g of the colorless solid polymer was initially obtained and after reprecipitation, as done in P30a, 37.5 g of the polymer (54% isolated yield) was obtained.

$^1$H-NMR analysis of the final product did not indicate the presence of residual monomer and the $^{13}$C NMR analysis revealed a composition of approximately 35/30/30/5 of ECHNB/TFENB/TFSNB/Acid NB. $M_w$, $M_n$ and PDI were determined to be 7723, 4350 and 1.78, respectively. A thin film (about 1 micron) of this polymer, spun on a silicon wafer from a 20% solution in PGMEA, had a CA of 76°±1°.

Example P30b

TFSNB/TFENB/ECHNB/Acid NB Polymer

This polymerization was done in the same manner as P30a, except that 0.36 g, 0.003 mol of triethylsilane was added to the solution in the reaction vessel and the solution in the crimp-cap vial was transferred to the reaction vessel under an inert atmosphere in accordance with a pre-determined metering protocol (0.065 mL/min for 54 minutes, 0.077 mL/min for 45 min, 0.041 mL/min for 84 min, 0.022 mL/min for 155 minutes, 0.012 mL/min for 286 minutes, 0.007 mL/min for 530 minutes, and 0.004 mL/min for 632 minutes).

38 g of the initial polymer was obtained and after reprecipitation using an excess of 85:15 MeOH/water, 35 g of the polymer (50% isolated yield) was obtained.

$^1$H-NMR of the final product did not indicate the presence of residual monomer and the $^{13}$C NMR analysis revealed a composition of approximately 35/32/29/4 of ECHNB/TFENB/TFSNBB/Acid NB. $M_w$, $M_n$ and PDI were determined to be 12453, 6043 and 2.06, respectively. A thin film (about 1 micron) of this polymer, spun on a silicon wafer from a 20% solution in PGMEA, had a CA of 75°±2°.

Example P31

ECHNB/TFENB/HFANB/Acid NB Polymer

In a 500 mL reaction vessel equipped with stirring, ECHNB (74.51 g, 0.300 mol), TFENB (53.34 g, 0.240 mol), and HFANB (16.45 g, 0.060 mol) were dissolved in toluene (180 g) in a dry box.

To the solution in the reaction vessel, Pd-1394 (0.8364 g, 0.00060 mol), Li FABA (1.5684 g, 0.0018 mol), and triethylsilane (2.91 g, 0.025 mol) were added, and the solution was stirred. Glacial acetic acid (0.72 g, 0.012 mol) was added to the solution, after which it was heated to 90° C. for 40 hours.

After treatment to remove catalyst residue from the polymer, the resulting solution was concentrated using a rotary evaporator and the polymer product was precipitated with an excess of 85:15 MeOH/water. The colorless solid polymer obtained (67 g) was dried overnight at 90° C. in a vacuum oven, dissolved in toluene and precipitated with an excess of hexane. The polymer was dried overnight at 90° C. in a vacuum oven to obtain 62 g of the polymer (43% isolated yield).

$^1$H-NMR of the final product did not indicate the presence of residual monomer and the $^{13}$C NMR analysis revealed a composition of approximately 46/40/9/5 of ECHNB/TFENB/HFANB/Acid NB. $M_w$, $M_n$, and PDI were determined to be 4116, 2478, and 1.66, respectively.

Example P32

TFSNB/NBHFAEsNB/Acid NB Polymer

To a glass reactor equipped with stirring, TFSNB (36.7 g, 0.144 mol), NBHFAEsNB (13.3 g, 0.036 mol), toluene (56.0 g), and ethyl acetate (19.0 g) were added. The mixture was sparged and then the reactor was placed in a dry box, after which solid DANFABA (0.481 g, 0.0006 mol), Pd-1206 (0.145 g, 0.00012 mol) and triethylsilane (1.465 g, 0.0126 mol) were added to the reactor. The reactor was then removed from the dry box and sparged glacial acetic acid (0.216 g, 0.0036 mol) added to the reaction mixture. The mixture was then heated to 100° C. for 18 hours with stirring. After allowing the mixture to cool to room temperature, it was subjected to purification to remove residual monomer and catalyst. Mw, Mn, and PDI were determined to be 5382, 3544, and 1.39, respectively. The polymer composition was found to be 84/14/2 (TFSNB/NBHFAEsNB/Acid NB) where as previously mentioned the Acid NB is derived from the acid dissociable monomer during purification of the polymer. From a film of the polymer cast onto a substrate. CA and SA were determined to be 80° and 25°, respectively. The dissolution rate in 0.26 N aqueous TMAH was found to be 1601 nm/sec.

Example P33

TFSNB Homopolymer

TFSNB (44.9 g, 0.176 mol), ethanol (0.811 g, 0.0176 mol), anhydrous toluene (72 mL), and propyleneglycol methylether (8 mL) were mixed in a 250 mL crimp-cap bottle containing a stirrer bar, sparged and then the bottle sealed. The bottle was brought into a dry box, unsealed and Pd-1206 (849 g, 0.0007 mol), DANFABA (1.69 g, 0.0021 mol), and triethylsilane (1.23 g, 0.0106 mol) were added. The bottle was re-sealed and the contents heated to 80° C., with stirring, in an oil bath for 21 hours. After the mixture was allowed to cool to room temperature, THF (10 g) was added. After treatment to remove catalyst and monomer residues from the resulting solution, it was concentrated using a rotary evaporator and the polymer product was precipitated with an excess of hexane to yield, after collection and drying in a vacuum oven at 90° C., 26 g of the homopolymer (58%). $M_w$, $M_n$, and PDI were determined to be 5580, 3810 and 1.47, respectively.

Prospective Example P1p TFSsecPrNB

In a dry box, TFSsecPrNB (10.0 g, 0.0353 mol), triethylsilane (0.286 g, 0.00247 mol), toluene (12 g), ethyl acetate (4 g), Pd-1206 (0.043 g, 0.000035 mol), and DANFABA (0.084 g, 0.000105 mol) are added to a glass reactor equipped with stirring. The reaction mixture is sparged then the reactor capped and brought out of the dry box. Sparged glacial acetic acid (0.094 g, 0.00157 mol) is added and the reaction mixture is heated to 100° C. for 15-20 hours and allowed to cool to room temperature. After purification to remove residual monomers and catalyst, the polymer is precipitated by adding the reaction mixture to excess hexane. After collection and drying, the solids are the target polymer.

LITHOGRAPHIC BEHAVIOR OF TFSNB HOMOPOLYMERS AS A TOP-COAT LAYERS

Example TC-1

Three 2.5 wt % solutions of TFSNB homopolymer in 2-methyl-1-propyl alcohol were prepared. For solution 1, the homopolymer has a Mw of 19,400, for solution 2, a Mw of 8500 and for solution 3, a Mw of 5300. Such homopolymers can be prepared, for example, in the manner of Example P33, but where the amount of triethylsilane and/or the reaction time is varied to achieve the different molecular weights. Each solution was applied onto a substrate to form a protective film having a thickness of about 300 nm.

Each of the three coated substrates were kept in contact with an aqueous 2.38 wt % solution of TMAH for 60 seconds (0.26N) and evaluated for the solubility thereof in the alkali developer. The evaluation was carried out by determining the thickness fluctuation of the protective film before and after the contact thereof with the alkali developer. The results are shown in Table R1, below:

TABLE R1

| Protective Film (molecular weight of polymer) | Protective Film Dissolution Speed (nm/sec) with Alkali Developer |
|---|---|
| 19400 | 1500 |
| 8500 | 1670 |
| 5300 | 1890 |

From the results in Table S, it is understood that the protective film-forming material of the invention has good solubility in alkali developer and is usable as an alkali-soluble protective film.

Example TC-2

Three additional coated substrates, prepared in the manner of Example TC-1, except for the coated film thickness which is shown in Table R2, were tested for resistance to water that may be used as a liquid in liquid immersion lithography. The evaluation was carried out by determining the thickness fluctuation of the protective film before and after the contact thereof with the water. The results are shown in Table R2, below:

TABLE R2

| Protective Film (molecular weight of polymer) | Film Thickness before rinsing treatment | Film Thickness after rinsing treatment for 120 seconds |
|---|---|---|
| 19400 | 1082 angstroms | 1082 angstroms |
| 8500 | 1069 angstroms | 1074 angstroms |
| 5300 | 1059 angstroms | 1063 angstroms |

From the results in Table R2, it is understood that the protective film-forming material of the invention has good resistance to water and is usable as a protective film in liquid immersion lithography.

Example TC-3

An organic antireflection film composition ARC29 (by Brewer Science, Inc.) was applied onto a silicon wafer with a spinner, and baked and dried on a hot plate at 205° C. for 60 seconds to form an antireflection film having a thickness of 77 nm. A positive photoresist composition for ArF TArF-P6111 (by Tokyo Ohka Kogyo Co., Ltd.) was applied onto the antireflection film, and pre-baked and dried on a hot plate at 130° C. for 90 seconds to form a photoresist film having a thickness of 150 nm on the antireflection film.

The protective film-forming materials used in Example TC-1 were applied onto the photoresist film, and heated at 90° C. for 60 seconds to form a protective film having a thickness of about 70 nm.

Next, using a laboratory kit for liquid immersion lithography (LEIES 193-1, by Nikon Corp.), the sample was tested for two-beam interference. Next, this was subjected to PEB treatment at 115° C. for 90 seconds, and then subsequently developed with an aqueous 2.38 wt % solution of TMAH at 23° C. for 60 seconds. In this development step, the protective film was completely removed, and the development of the photoresist film was good.

Thus obtained, the line-and-space pattern having a pitch of 65 nm was observed with a scanning electronic microscope (SEM), and its pattern profile was good.

Example TC-4

An organic antireflection film composition ARC29 (by Brewer Science, Inc.) was applied onto a silicon wafer with a spinner, and baked and dried on a hot plate at 205° C. for 60 seconds to form an antireflection film having a thickness of 77 nm. A positive photoresist composition TArF-P6111 (by Tokyo Ohka Kogyo Co., Ltd.) was applied onto the antireflection film, and pre-baked and dried on a hot plate at 130° C. for 90 seconds to form a photoresist film having a thickness of 170 nm on the antireflection film.

The protective film-forming materials used in Example TC-1 were applied onto the photoresist film, and heated at 90° C. for 60 seconds to form a protective film having a thickness of 70 nm.

Pure water was dropped onto the substrate with the protective film formed thereon, for 30 seconds, and then, using a photo-exposure device (NSR-S302 by Nikon Corp.), this was exposed to light of 193 nm ArF excimer laser, and then pure water was further dropped thereon for 60 seconds. Next, this was subjected to PEB treatment at 115° C. for 90 seconds, and then subsequently developed with an aqueous 2.38 wt % solution of TMAH at 23° C. for 60 seconds.

The number of defects on the thus-obtained line-and-space pattern (1:1) having a pitch of 130 nm was counted with KLA2351 (by KLA Tencor Co., Ltd.), and it decreased to 0.5% of the number thereof in a control sample not having a protective film formed thereon.

LITHOGRAPHIC BEHAVIOR OF TFSNB COPOLYMERS AS A TOP-COAT LAYERS

Examples TC-5a-f

The copolymers of TFSNB indicated in Table S, as a 4 wt % solution in isobutanol, were evaluated to determine contact angle (CA), sliding angle (SA), dissolution rate (DR) in aqueous alkali developer and waterproofness (WP) using the methods of previously described measurement set 2. As the data presented indicates, films formed from such samples exhibited contact and sliding angles, waterproofness and dissolution rates that are indicate such materials as being acceptable for use as protective films (top-coats) in an immersion lithographic process. In addition, the evaluation of such films with regard to scanability, also produced acceptable results.

TABLE S

| Example No. | CA | SA | WP | DR |
|---|---|---|---|---|
| P1 | 70° | 21° | −0.2% | 2210 nm/s |
| P12 | 73° | 17° | −0.1% | 1950 nm/s |
| P2 | 78° | 19° | −0.2% | 913 nm/s |
| P3 | 93° | 18° | −0.5% | 600 nm/s |
| P16 | 93° | 16° | −0.1% | 272 nm/s |
| P13 | 89° | 20° | −0.2% | 230 nm/s |

Further to the evaluation of the above copolymers, a first set of coated silicon wafers were prepared by applying the following film forming materials to the wafer by a spin coating method. For each wafer, first an organic antireflection film composition "ARC29" (by Brewer Science, Inc.) was applied to the wafer, and baked and dried on a hot plate at 225° C. for 60 seconds to form an antireflection film having a thickness of about 77 nm. Next a positive photoresist composition for ArF "TARF-P6111ME" (by Tokyo Ohka Kogyo Co., Ltd.) was applied onto the antireflection film, and pre-baked and dried on a hot plate at 130° C. for 90 seconds to form a photoresist film having a thickness of about 225 nm. Then, a composition of each of the copolymers from Table S was applied onto one of the coated wafers, over the photoresist film, and heated at 90° C. for 60 seconds to form a protective film or top-coat layer having a thickness of about 140 nm, thereover.

Next, using a "NSR S302A" (by Nikon Corp.) lithographic tool having a 193 nm ArF excimer laser source, each of the coated wafers was subjected to ordinary dry exposure through a mask pattern. After the exposure, pure water at 23° C. was dropped onto the protective film for 1 minute while the substrate was kept rotating on a spinner chuck to simulate an immersion lithography environment. After the addition of pure water thereto, the substrate was subjected to PEB treatment at 130° C. for 90 seconds, and then subjected to an alkali developer (aqueous 0.26N TMAH solution) at 23° C. for 60 seconds during a pattern development process. As a result of this development process, the top-coat layer was completely removed, and a well developed pattern formed in the resist film. Such pattern, a line-and-space (1:1) resist pattern having a pitch of 130 nm, was observed with a scanning electronic microscope (SEM), and its pattern profile had a good rectangular form.

Continuing the evaluation of the copolymers of Table S, a second set of coated silicon wafers was prepared as described above for the first set except that the thickness of the resist film was 150 nm. However, the second set of wafers was subjected to exposure using a laboratory kit for liquid immersion lithography (LEIES 193-1, by Nikon Corp.), where the LEIES was set for two-beam interference exposure of each wafer using a 193 nm ArF excimer laser source.

After exposure, each of the wafers was subjected to the development process used for the first set. This development process completely removed the top-coat layer to reveal a well developed pattern formed in the resist film. Such pattern, the line-and-space (1:1) resist pattern having a pitch of 65 nm, was observed with an SEM and found to have a good pattern profile with a good rectangular form.

Immersion Exposure Evaluation of Compositions from P30a-c and P31

The polymers of Examples P30a-c and P31 were used to prepare imagable polymer compositions according to Table T, below:

TABLE T

| | Component (A): Resin [Weight] | Component (B): Acidifier [Weight] | Component (D): Amino [Weight] | Component (S): Solvent [Weight] |
|---|---|---|---|---|
| Composition of P30a | Polymer P30a [100] | (B)-1 [3] | (D)-1 [0.3] | (S)-1 [1290] |
| Composition of P30b | Polymer P30b [100] | (B)-1 [3] | (D)-1 [0.3] | (S)-1 [1290] |
| Composition of P30c | Polymer P30c [100] | (B)-1 [3] | (D)-1 [0.3] | (S)-1 [1290] |
| Alternative composition P31 | Polymer P31 [100] | (B)-1 [3] | (D)-1 [0.3] | (S)-1 [1290] |

Abbreviations in Table R have the following meanings:
(B)-1: p-toluenediphenylsulfoniumnanoflurobutanesulfonate;
(D)-1: triethanolamine;
(S)-1: Mixed solvent, PGMEA/PGME = 6/4 (mass ratio); and
Values in brackets are ratios to the whole (mass ratio).

On an eight-inch silicon wafer an organic antireflective coating material (Brewer Science, product ARC-29A) was applied and baked at 205° C. for 60 seconds to obtain a 77 nm film. The wafer and film was used as the substrate. On this substrate an even coating of each of the polymer compositions was applied by use of a spinner, prebaked at 110° C. for 90 seconds on a hotplate, and permitted to dry, to form an imagable polymer layer having a thickness of about 130 nm.

Next, using a LEIES 193-1 two-beam interferometer (manufactured by Nikon) for immersion exposure, immersion two-beam interferometer exposure was performed using a prism, water, and two 193 nm interferometers. This method has been reported in the Journal of Vacuum Science & Technology B (US) (19:6 2001, p. 2353-2356) and is publicly known as a method usable in research labs for obtaining line and space (L&S) patterns.

The substrates were then subjected to a post exposure bake (PEB) at 100° C. for 90 seconds, and put through puddle development for 60 seconds in 2.38 wt % aqueous tetramethyl ammonium hydroxide (TMAH) at 23° C., followed by rinsing in pure water for 30 seconds, after which they were spin-dried, obtaining 1:1 for the resist pattern ("L/pattern" below).

When the L/S pattern for each example was observed using a scanning electron microscope (SEM), the line and space at 65 nm yielded a 1:1 resist pattern. Further, regarding the form of the resist pattern, the lines showed no waviness and little roughness.

Comparative Example

As part of the above immersion exposure evaluation, the patterns formed using the compositions made from the polymers of Examples P30a-c were compared to patterns of an alternative composition, formed using the polymer of Example P31.

When the L/S pattern obtained using the alternative composition by the same exposure method was observed using the SEM, the line and space for 65 nm formed a resist pattern of 1:1. However, the form of the resist pattern showed remarkable unevenness and much roughness in the lines.

Film Resistance to Alcohol

Two wafers were coated, by the previously described method, with the polymer compositions of Examples 30b and 30c and the thickness of each film was measured. Next, after the temperature of the substrate was permitted to fall to room temperature, isobutanol was dripped from a nozzle and the resist film thickness was re-measured after it was placed in a rotary drier. The loss in the case of Example 2 resist was 12.7 nm and that of Example 3 was 9.2 nm.

However, when the same alcohol resistance test was performed on a wafer coated with the alternate composition, a loss of 20.2 nm was observed.

Other alcohols such as 4-methyl-2-pentanol are expected to yield similar results.

As is clear from the above results, the polymer compositions made using the polymers of Examples 30a-c yielded a film that gave a high-resolution resist pattern as a result of immersion exposure. Further, good results were obtained, there was little film loss, in the alcohol-resistance test. Still further, when a top-coat film was formed from a polymer composition using an alcoholic solvent, good results were obtained in that no intermixing stratum was formed between the resist stratum and the top-coat film stratum.

In comparison the pattern obtained by immersion exposure of the alternate composition was not good, and there was considerable loss of film resulting from the alcohol resistance test.

Moreover, the films formed from the compositions using the polymers of Examples P30a-c, were each found to be highly water repellant, that is to say they had high hydrophobicity, and when used as a photoresist for immersion lithography, as above, without use of protective film, good results were obtained in that there was little dissolution of the immersion liquid (e.g., water) from the resist film.

It should be realized that by and through the examples, data and discussion thereof has been provided that demonstrate that embodiments of top coat polymers, top coat (protective film-forming) materials formed using such polymers, top coat layers formed thereof and processes for using such layers provide solutions to the aforementioned problems found with previously known materials. Such top coat materials and layers formed thereof provide alkali solubility, resistance to an immersion fluid, low solubility to and with photoresist layer components, good protection against leaching from and/or to such photoresist layer and good protection as gas-barrier layer and low optical densities. In addition, top coat materials and layers formed thereof provide, during an immersion lithographic process, excellent scanability and reduced defectivity as compared to a process where such a top coat layer is not used. Further, such layers demonstrate high contact and receding angles and a low sliding angle which are believed desirable for such performance. Also, it should be realized that the examples provided herein are not limiting, but rather exemplary of what might be obtained through a process of polymer design. For example a film was formed from a 4 wt % solution of a non-self imagable polymer of TFSNB and NBXOH (97:3) in isobutanol a found to have a CA of 70°, a SA of 22°, a dissolution rate (DR) of 1710 nm/sec and a waterproofness of −2%. Also, films formed from 4 wt % solutions of the non-self imagable polymers TFSNB and NBHFAEsNB (90:10) and TFSNB and NBHFAEsNB(80:20) in isobutanol were found to have CAs of 70° and 71°, SAs of 23° and 21°, DRs of 1937 nm/sec and 1654 nm/sec and waterproofness of −0.2% and −0.1%, respectively. Like the non-self imagable disclosed in Examples TC5a-f, this polymer also exhibited advantageous results after both the wet and dry exposure imaging tests described for such examples.

In addition, that such data and discussions thereof also demonstrate that embodiments of imagable polymers, imagable materials (photoresists) formed from such polymers, imagable layers (photoresist layers or films) formed thereof and processes for using such layers can also provide solutions to the aforementioned problems or can be utilized with the aforementioned top coat materials and layers to provide such solutions. Such photoresist materials and films formed therefrom show good resistance to an immersion fluid, little or no interaction with the aforementioned top coat embodiments and during an immersion lithographic process, they show excellent scanability and reduced defectivity as compared to a process where an alternate photoresist material is used. Further, such layers demonstrate high contact and receding angles and a low sliding angle which are believed desirable for such performance.

While the invention has been explained in relation to descriptions of various embodiments and examples, it is to be understood that modifications thereof will become apparent to those skilled in the art upon reading this specification. Any such modifications are therefore within the scope and spirit of the embodiments of the present invention and shall be understood to fall within the scope of the appended claims.

What is claimed is:

1. An imageable polymer consisting of norbornene-type repeating units, said polymer comprising a first norbornene-type repeating unit represented by Formula I:

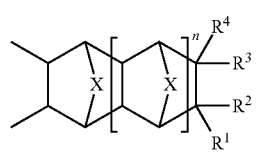

where X is —$CH_2$—, —$CH_2CH_2$—, O or S; n is an integer from 0 to 5 inclusive; each of $R^1$ to $R^4$ independently represents hydrogen, a linear or branched alkyl group, or a linear or branched haloalkyl group, subject to the proviso that at least one of $R^1$ to $R^4$ is a -$QNHSO_2R^5$ group where Q is a linear or branched alkyl spacer of 1 to 5 carbons, and $R^5$ is a perhalo group of 1 to 10 carbon atoms;

a second norbornene-type repeating unit represented by Formula V:

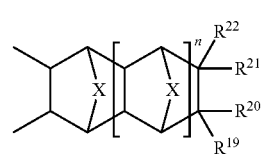

where X is —$CH_2$—, —$CH_2CH_2$—, O or S; n is an integer from 0 to 5 inclusive; each of $R^{19}$ to $R^{22}$ independently represents hydrogen, a linear or branched alkyl group, or a linear or branched haloalkyl group, subject to the proviso that at least one of $R^{19}$ to $R^{22}$ is a group represented by formula G:

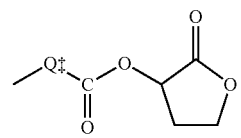

where $Q^‡$ is an optional linear or branched alkyl spacer where if present is of 1 to 5 carbons;

a third norbornene-type repeating unit represented by Formula VI:

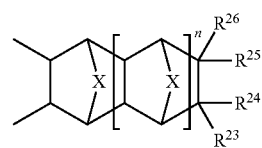

where in Formula VI, X and n are as defined for Formula V, and each of $R^{23}$ to $R^{26}$ independently represents hydrogen, a linear or branched alkyl group, or a linear or branched haloalkyl group, but with the proviso that least one of $R^{23}$ to $R^{26}$ is a group represented by one of formulae:

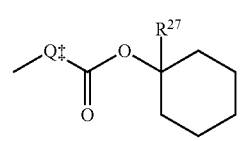

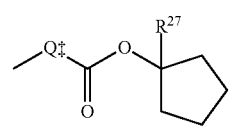

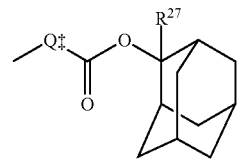

where $Q^‡$ is as defined above and $R^{27}$ is a linear or branched alkyl group of 1 to about 5 carbon atoms; and a fourth type of repeating unit represented by Formula VI acid:

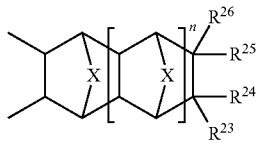

(VI acid)

where in Formula VI acid, X, n and $R^{23}$ to $R^{26}$ are as defined for Formula VI, but with the proviso that least one of $R^{23}$ to $R^{26}$ is a $Q^{\ddagger}$-COOH group where $Q^{\ddagger}$ is also as defined for Formula VI, where said imageable polymer is imageable in the presence of a photoacid generator.

2. The imageable polymer of claim 1 where for the repeating unit represented by Formula I, Q is a linear alkyl group of 1 to 3 carbons.

3. The imageable polymer of claim 2 where for the repeating unit represented by Formula I, Q is $CH_2$ and $R^5$ is $CF_3$.

4. The imageable polymer of claim 3 where some of the repeating units represented by Formula I are replaced with a repeating unit represented by Formula VII:

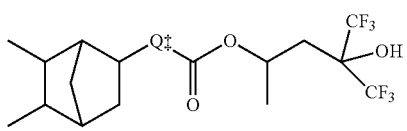

VII where $Q^{\ddagger}$ is an optional linear or branched alkyl spacer where if present is of 1 to 5 carbons.

5. The imageable polymer of claim 3 where for the repeating unit represented by Formula VI, one of $R^{23}$ to $R^{26}$ is group H where $R^{27}$ is 1 or 2 carbons and $Q^{\ddagger}$ is either not present or is $CH_2$.

6. The imageable polymer of claim 3 where for the repeating unit represented by Formula VI, one of $R^{23}$ to $R^{26}$ is group J where $R^{27}$ is 1 or 2 carbons and $Q^{\ddagger}$ is either not present or is $CH_2$.

7. The imageable polymer of claim 3 where for the repeating unit represented by Formula VI, one of $R^{23}$ to $R^{26}$ is group K where $R^{27}$ is 1 or 2 carbons and $Q^{\ddagger}$ is either not present or is $CH_2$.

8. The imageable polymer of claim 1 comprising, independently, from 1 to 50 mol % of each of the first type of repeating unit and the second type of repeating unit and from 20 to 80 mol % of the third type of repeating unit.

9. The imageable polymer of claim 8 comprising from 30 to 70 mol % of the third type of repeating unit, from 10 to 40 mol % of the first type of repeating unit and from 5 to 30 mol % of the second type of repeat unit.

10. The imageable polymer of claim 1 comprising from 20 to 80 mol % of the third type of repeating unit and the fourth type of repeating unit, and from 1 to 50 mol % of the second type of repeating unit.

11. The imageable polymer of claim 10 where the fourth type of repeating unit is derived from the third type of repeating unit and is from 5 to 30% of the sum of the third type of repeating unit and the fourth type of repeating unit.

12. The imageable polymer of any of claims 8-11 having a molecular weight ($M_w$) of from 2000 to 10000.

13. The imageable polymer of claim 12 having a $M_w$ of from 3500 to 7000.

14. The imageable polymer of claim 1 comprising from 45 to 65 mol % of the sum of the third repeating unit and the fourth repeating unit, 5 to 25 mol % of the second repeating unit, and from 25 to 35 mol % of the first repeating unit; where for the first repeating unit n is 0, Q is $CH_2$ and $R^5$ is $CF_3$; where for the second repeating n is 0, $Q^{\ddagger}$ is not present, for the third type of repeating unit n is 0, one of $R^{23}$ to $R^{26}$ is group (H) where $R^{27}$ is $CH_2CH_3$ and the others of $R^{23}$ to $R^{26}$ are hydrogen, and where for the sum of the third type of repeating unit and the fourth type of repeating unit, the amount of the fourth type of repeating unit is from 10 to 25 mol %.

15. The imageable polymer of claim 14 having a molecular weight ($M_w$) of from 3500 to 6500 and a polydispersity of less than 2.

16. A method for making an imageable polymer consisting of norbornene-type repeating units comprising:

charging a reaction vessel with a first norbornene-type monomer represented by Formula IA:

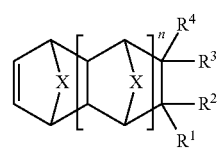

(IA)

where X is —$CH_2$—, —$CH_2CH_2$—, O or S; n is an integer from 0 to 5 inclusive; each of $R^1$ to $R^4$ independently represents hydrogen, a linear or branched alkyl group, or a linear or branched haloalkyl group, subject to the proviso that at least one of $R^1$ to $R^4$ is a -$QNHSO_2R^5$ group where Q is a linear or branched alkyl spacer of 1 to 5 carbons, and $R^5$ is a perhalo group of 1 to 10 carbon atoms;

a second norbornene-type repeating unit represented by Formula VA:

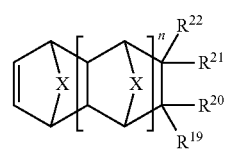

(VA)

where X is —$CH_2$—, —$CH_2CH_2$—, O or S; n is an integer from 0 to 5 inclusive; each of $R^{19}$ to $R^{22}$ independently represents hydrogen, a linear or branched alkyl group, or a linear or branched haloalkyl group, subject to the proviso that at least one of $R^{19}$ to $R^{22}$ is group G:

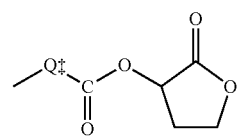

G where $Q^{\ddagger}$ is an optional linear or branched alkyl spacer where if present is of 1 to 5 carbons;

a third norbornene-type repeating unit represented by Formula VIA:

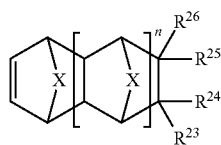

(VIA)

where X, n and $R^{23}$ to $R^{26}$ are as defined for Formula I but with the proviso that least one of $R^{23}$ to $R^{26}$ is a group represented by the formula:

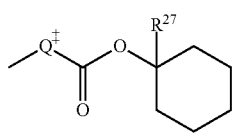

H where $Q^{\ddagger}$ is as defined above and $R^{27}$ is a linear or branched alkyl group of 1 to about 5 carbon atoms; and a fourth type of repeating unit represented by Formula VI acid:

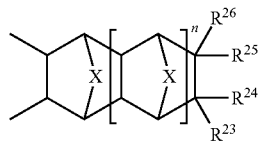

(VI acid)

where in Formula VI acid, X, n and $R^{23}$ to $R^{26}$ are as defined for Formula VI, but with the proviso that least one of $R^{23}$ to $R^{26}$ is a $Q^{\ddagger}$-COOH group where $Q^{\ddagger}$ is also as defined for Formula VI;

further charging the reaction vessel with an appropriate solvent, a catalyst and an optional cocatalyst;

providing agitation to the reaction vessel contents to cause the first monomer, any optional other monomers, catalyst and optional cocatalyst to dissolve in the solvent; and providing heat and continued agitation to the contents for a time sufficient to cause polymerization of the monomers therein, where said imageable polymer is imageable in the presence of a photoacid generator.

17. The method of claim 16 where further charging the reaction vessel comprises charging the reaction vessel with:
a solvent selected from the group benzene, toluene, xylene, hexane, heptane, cyclohexane, dichloromethane, ethylchloride, tetrahydrofuran, ethyl acetate and mixtures thereof;
an optional cocatalyst selected from lithium tetrakis(pentafluorophenyl)borate diethyl etherate (LiFABA) and N-dimethylanilinium tetrakis-(pentafluorophenyl)borate (DANFABA); and
a catalyst selected from (Acetonitrile) bis(triisopropylphosphine)palladium(acetate) tetrakis (pentafluorophenyl)borate (Pd 1206) and (Acetonitrile) bis(tricyclohexyl-t-butylphosphine)palladium(acetate) tetrakis (pentafluorophenyl)borate (Pd 1394).

18. The method of claim 16 or 17 where providing heat comprises heating the contents of the reaction vessel to a temperature selected from the range of from 60° C. to 100° C. and maintaining the contents at that temperature for the lesser of 24 hours or the completion of the polymerization reaction.

* * * * *

UNITED STATES PATENT AND TRADEMARK OFFICE
CERTIFICATE OF CORRECTION

PATENT NO. : 8,329,838 B2
APPLICATION NO. : 12/884786
DATED : December 11, 2012
INVENTOR(S) : Larry F. Rhodes et al.

Page 1 of 1

It is certified that error appears in the above-identified patent and that said Letters Patent is hereby corrected as shown below:

Column 51, Line 49, Claim 1, delete "norbomene-type" and insert -- norbornene-type --

Column 54, Line 1, Claim 13, delete "$M_w$," and insert -- $M_w$ --

Column 55, Lines 22-23, Claim 16, after " 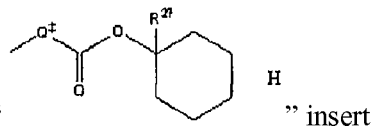 " insert

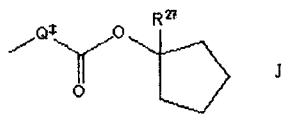 J

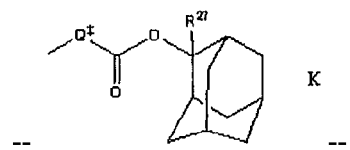 K

-- --

Signed and Sealed this
Nineteenth Day of February, 2013

Teresa Stanek Rea
*Acting Director of the United States Patent and Trademark Office*